(12) United States Patent
Zang

(10) Patent No.: US 9,356,047 B2
(45) Date of Patent: May 31, 2016

(54) INTEGRATED CIRCUITS WITH SELF ALIGNED CONTACT STRUCTURES FOR IMPROVED WINDOWS AND FABRICATION METHODS

(71) Applicant: GLOBALFOUNDRIES Inc., Grand Cayman (KY)

(72) Inventor: Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/461,700

(22) Filed: Aug. 18, 2014

(65) Prior Publication Data

US 2016/0049427 A1 Feb. 18, 2016

(51) Int. Cl.
| | | |
|---|---|---|
| H01L 21/00 | (2006.01) | |
| H01L 27/12 | (2006.01) | |
| H01L 23/528 | (2006.01) | |
| H01L 21/84 | (2006.01) | |
| H01L 21/311 | (2006.01) | |
| H01L 21/3105 | (2006.01) | |
| H01L 21/321 | (2006.01) | |
| H01L 21/768 | (2006.01) | |
| H01L 29/66 | (2006.01) | |
| H01L 29/78 | (2006.01) | |

(52) U.S. Cl.
CPC ...... *H01L 27/1211* (2013.01); *H01L 21/31053* (2013.01); *H01L 21/31111* (2013.01); *H01L 21/32115* (2013.01); *H01L 21/76897* (2013.01); *H01L 21/845* (2013.01); *H01L 23/528* (2013.01); *H01L 29/6656* (2013.01); *H01L 29/785* (2013.01)

(58) Field of Classification Search
CPC ............ H01L 29/785; H01L 21/76897; H01L 21/845

USPC .......................................... 257/347; 438/157
See application file for complete search history.

(56) References Cited

U.S. PATENT DOCUMENTS

| | | | | |
|---|---|---|---|---|
| 2005/0136649 | A1* | 6/2005 | Lee | H01L 21/76897 438/637 |
| 2007/0057325 | A1* | 3/2007 | Hsu | H01L 29/785 257/347 |
| 2013/0288468 | A1* | 10/2013 | Chi | H01L 29/665 438/525 |
| 2013/0320399 | A1* | 12/2013 | Chang | H01L 29/7848 257/190 |
| 2014/0141586 | A1* | 5/2014 | Hu | H01L 21/823481 438/290 |
| 2014/0377918 | A1* | 12/2014 | Cheng | H01L 29/785 438/163 |
| 2015/0104913 | A1* | 4/2015 | Liu | H01L 21/823821 438/229 |

* cited by examiner

*Primary Examiner* — David Vu
*Assistant Examiner* — Brandon Fox
(74) *Attorney, Agent, or Firm* — Heslin Rothenberg Farley & Mesiti P.C.

(57) ABSTRACT

Devices and methods for forming semiconductor devices with self aligned contacts for improved process windows are provided. One method includes, for instance: obtaining a wafer with at least two gates, forming partial spacers adjacent to the at least two gates, and forming at least one contact on the wafer. One intermediate semiconductor device includes, for instance: a wafer with an isolation region, at least two gates disposed on the isolation region, at least one source region disposed on the isolation region, at least one drain region disposed on the isolation region, and at least one contact positioned between the at least two gates, wherein a first portion of the at least one contact engages the at least one source region or the at least one drain region and a second portion of the at least one contact extends above a top surface of the at least two gates.

9 Claims, 22 Drawing Sheets

INTEGRATED CIRCUITS WITH SELF ALIGNED CONTACT STRUCTURES FOR IMPROVED WINDOWS AND FABRICATION METHODS

FIELD OF THE INVENTION

The present invention relates to semiconductor devices and methods of fabricating semiconductor devices, and more particularly, to integrated circuits with self aligned contact structures for improved windows and fabrication methods.

BACKGROUND OF THE INVENTION

As semiconductor devices changed from complementary metal-oxide-semiconductor (CMOS) to FinFET devices, shorts between the poly gate and source and drain contacts became more common and contribute to a decrease in yield of the FinFET devices. As FinFET devices continue to decrease in size, shorts have become even more common. These shorts have a direct effect on the yield of the semiconductor devices. Thus, fabrication of FinFET devices which improve yield is needed.

BRIEF SUMMARY

The shortcomings of the prior art are overcome and additional advantages are provided through the provision, in one aspect, a method includes obtaining a wafer with at least two gates; forming partial spacers adjacent to the at least two gates; and forming at least one contact on the wafer.

In another aspect, a device is provided which includes, for instance: a wafer with an isolation region; at least two gates disposed on the isolation region; at least one source region disposed on the isolation region; at least one drain region disposed on the isolation region; and at least one contact positioned between the at least two gates; wherein a first portion of the at least one contact engages the at least one source region or the at least one drain region and a second portion of the at least one contact extends above a top surface of the at least two gates.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain semiconductor devices, for example, field-effect transistors (FETs), which provide advantages over the above noted, existing semiconductor devices and fabrication processes. Advantageously, the semiconductor device fabrication processes disclosed herein provide for devices with an improved yield and lower parasitic capacitance.

Figure 1:
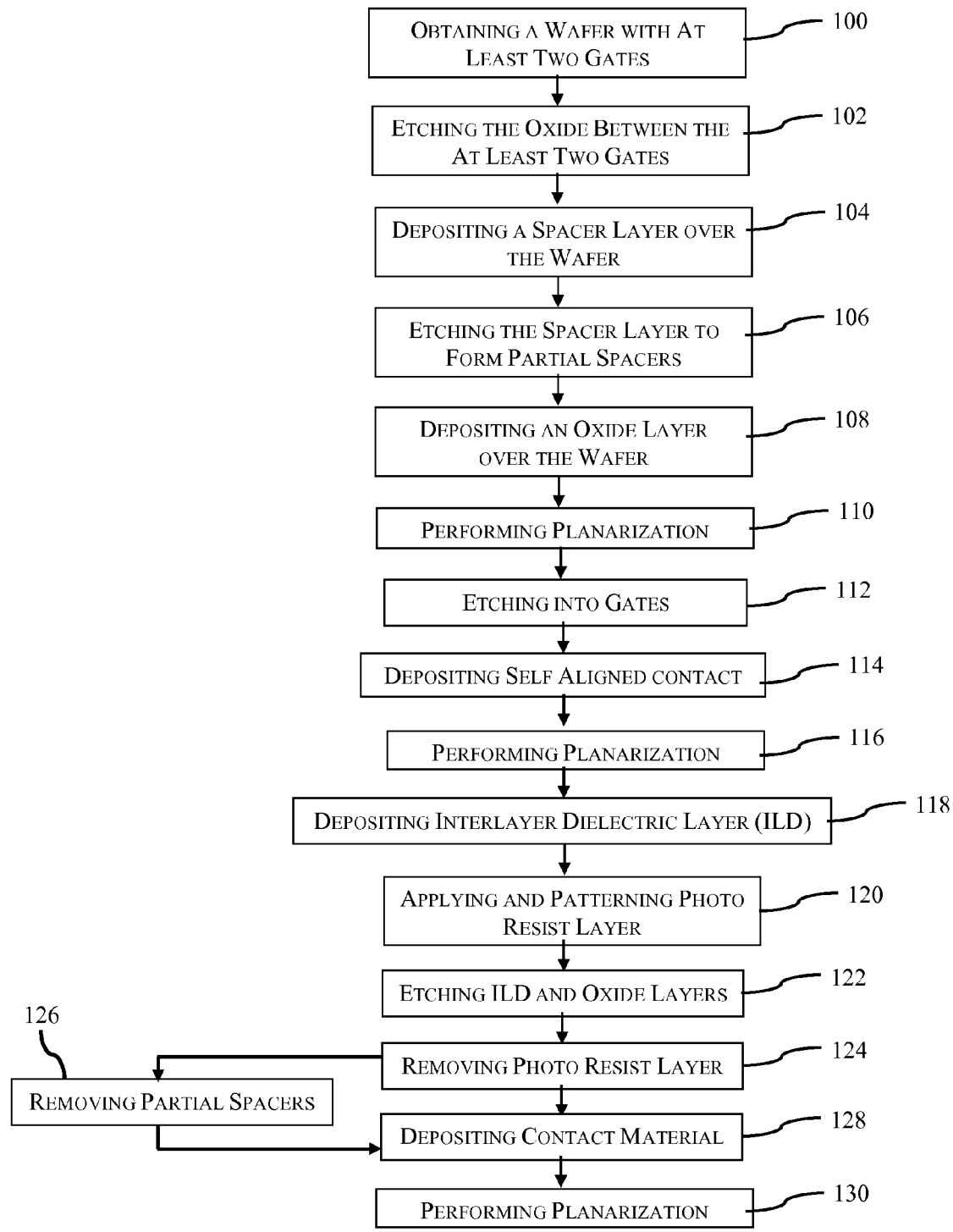
FIG. 1 depicts one embodiment of a method for forming self-aligned contacts, in accordance with one or more aspects of the present invention.

In one aspect, in one embodiment, as shown in FIG. 1, semiconductor device formation process in accordance with one or more aspects of the present invention may include, for instance: obtaining wafer with at least two gates 100; etching between the at least two gates 102; depositing a spacer layer over the wafer 104; etching the spacer layer to form partial spacers 106; depositing an oxide layer over the wafer 108; performing planarization of the oxide layer 110; etching into the at least two gate 112; depositing a self-aligned contact layer over the device 114; performing planarization of the self-aligned contact layer 116; depositing an interlayer dielectric layer 118; applying and patterning a photo resist layer 120; etching the interlayer dielectric layer and the oxide layer 122; removing the photo resist layer 124; depositing a contact material layer 128; and performing planarization of the contact material layer 130. The semiconductor device formation may also include, for instance: removing the partial spacers 126 prior to depositing the contact material layer.

Figure 2:
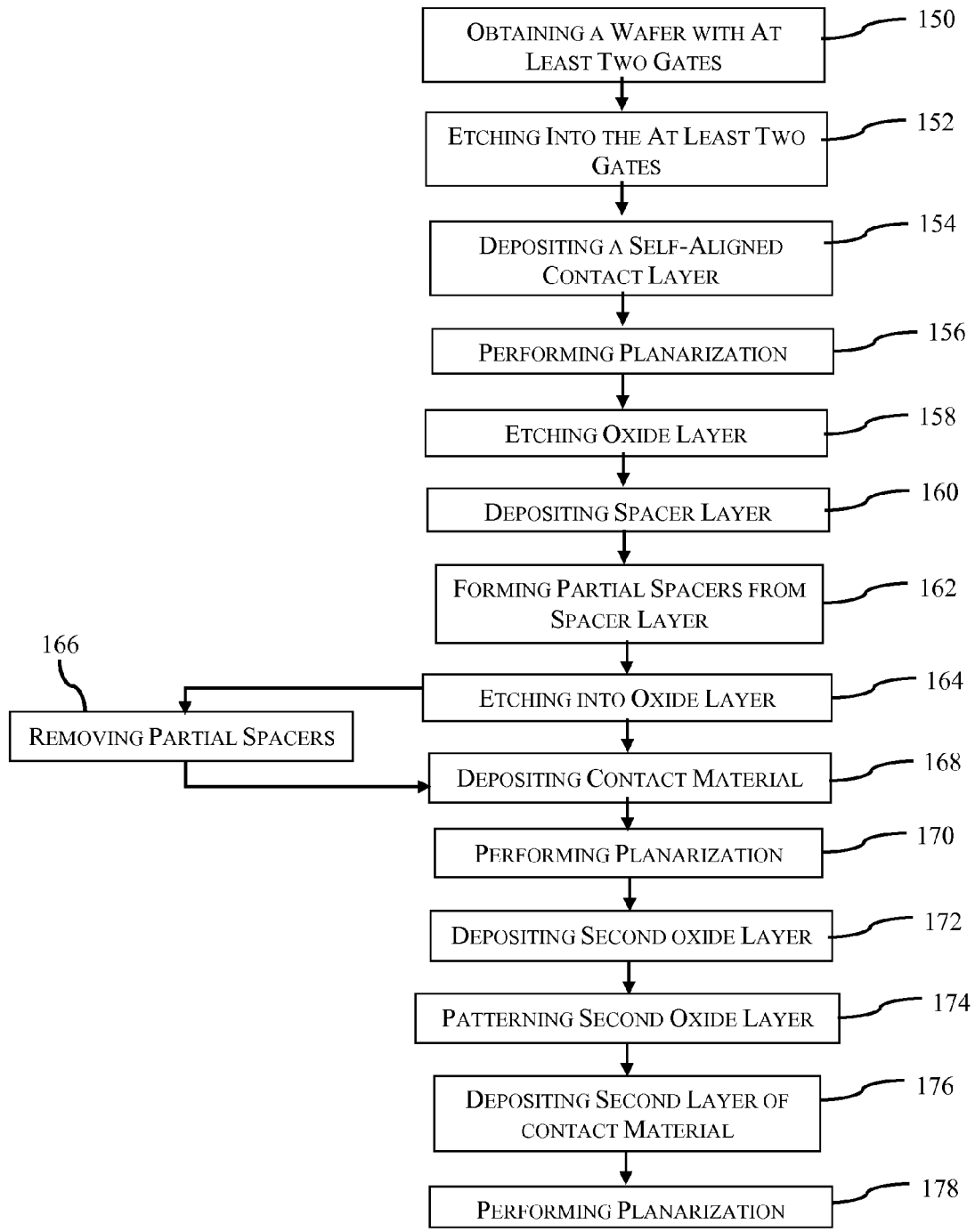
FIG. 2 depicts another embodiment of a method for forming self-aligned contacts, in accordance with one or more aspects of the present invention.

In another embodiment, as shown in FIG. 2, a semiconductor formation process in accordance with one or more aspects of the present invention and may include, for instance: obtaining a wafer with at least two gates 150; etching into the at least two gates 152; depositing a self-aligned contact layer over the device 154; performing planarization of the self-aligned contact 156; etching the oxide layer 158; depositing a spacer layer 160; forming partial spacers from the spacer layer 162; etching the oxide layer 164; depositing contact material over the device 168; performing planarization of the contact material 170; depositing a second oxide layer 172; patterning the second oxide layer 174; depositing a second layer of contact material 176; and performing planarization of the second layer of contact material 178. The semiconductor device formation may also include, for instance: removing the partial spacers 166 prior to depositing the first contact material layer.

FIGS. 3-17 depict, by way of example only, one detailed embodiment of a portion of a FinFET device formation process of FIG. 1 and a portion of an intermediate FinFET structure, in accordance with one or more aspects of the present invention. Note again that these figures are not drawn to scale in order to facilitate understanding of the invention, and that the same reference numerals used throughout different figures designate the same or similar elements.

Figure 3:
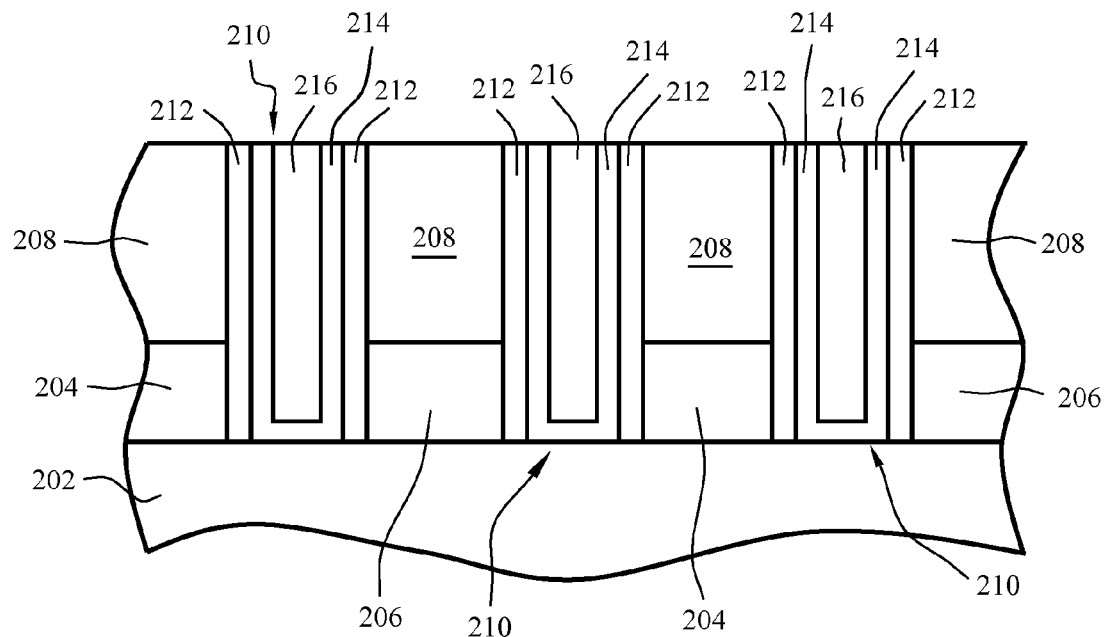
FIG. 3 depicts a cross-sectional elevation view of a semiconductor device with at least two gates formed on a wafer, in accordance with one or more aspects of the present invention.

FIG. 3 shows a portion of semiconductor device 200 obtained during the fabrication process. The device 200 may have been processed through initial device processing steps in accordance with the design of the device 200 being fabricated, for example, the device 200 may include, for example, an isolation region 202, at least one source region 204, at least one drain region 206, and at least one gate 210. The at least one source region 204, at least one drain region 206, and at least one gate 210 are positioned over the isolation region 202. The at least one source region 204 and at least one drain region 206 may be, for example, embedded silicon germanium (eSiGe) for pFETs or embedded silicon phosphorus (eSiP) for nFETs. The device 200 may also include an oxide layer 208 surrounding or positioned between the at least one gate 210. The at least one gate 210 may be separated from the oxide layer 208 by spacers 212. In addition, the at least one gate 210 may include, for example, at least one work function metal 214 and a gate metal 216.

Figure 4:
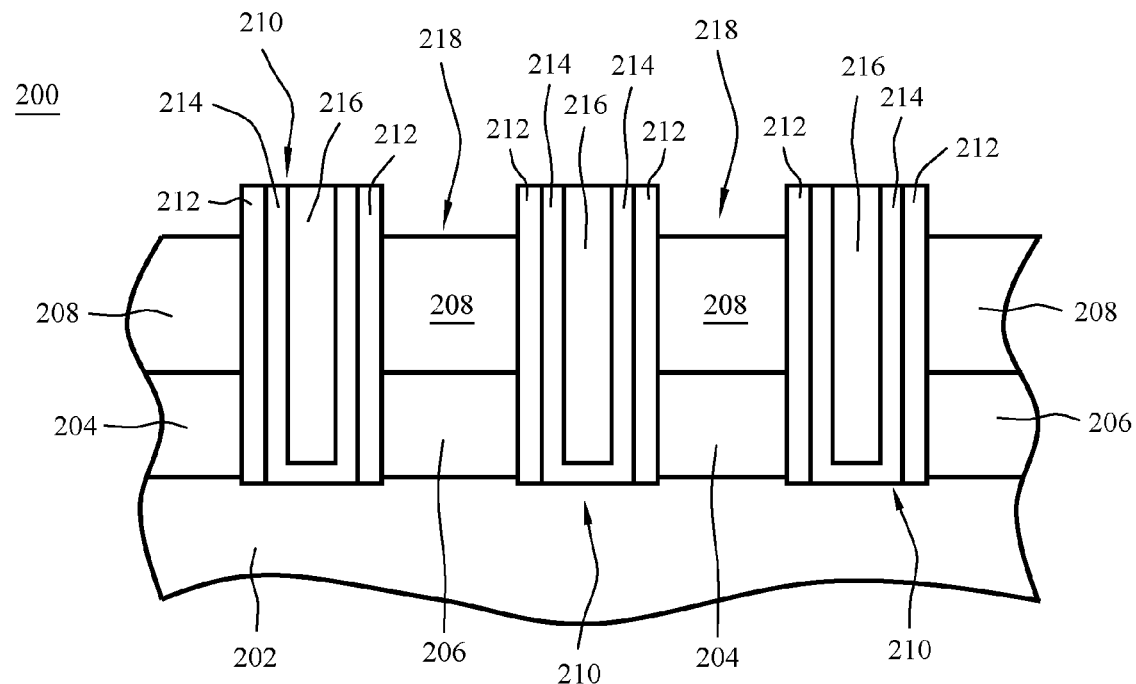
FIG. 4 depicts the structure of FIG. 3 after etching the oxide between the gates, in accordance with one or more aspects of the present invention.
Figure 5:
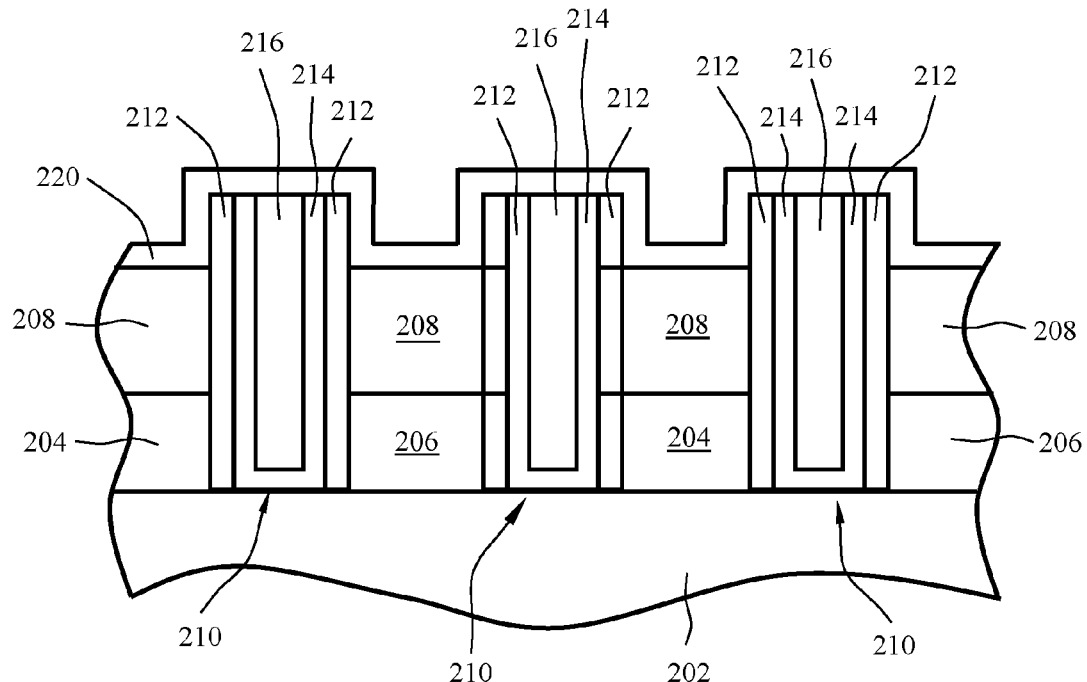
FIG. 5 depicts the structure of FIG. 4 after deposition of a spacer layer, in accordance with one or more aspects of the present invention.
Figure 6:
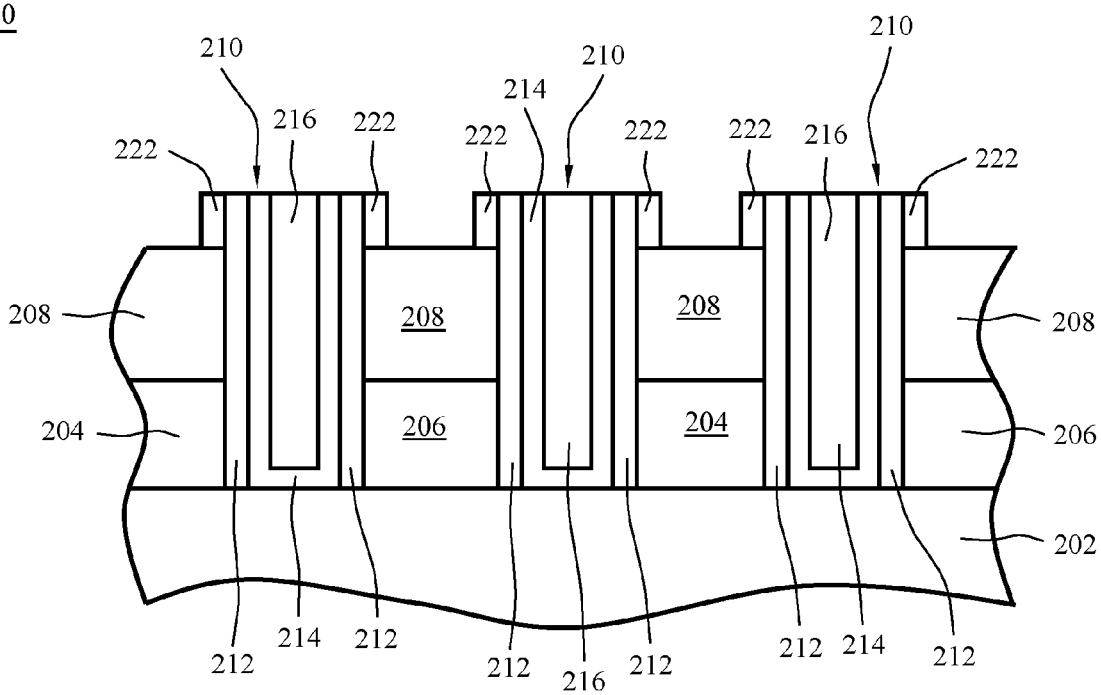
FIG. 6 depicts the structure of FIG. 5 after etching the spacer layer to form partial spacers, in accordance with one or more aspects of the present invention.

As depicted in FIG. 4, the oxide layer 208 may be partially etched to form cavities 218 between the gates 210. The etching of the oxide layer 208 may be, for example, a dry etch or a wet etch. The cavities 218 may have a depth below the top surface of the gates 210 of, for example, approximately 5 nm to 100 nm and, more specifically, approximately 15 nm to 45 nm. Next a spacer layer 220 may be deposited over the device 200, as shown in FIG. 5. The spacer layer 220 may be, for example, a material with an etch selectivity to oxide, such as, SiN, SiCO, another low κ material, a high κ material, or a metal. Then the spacer layer 220 may be etched to form a plurality of partial spacers 222, as shown in FIG. 6. The partial spacers 222 may be positioned next to the spacers 212 outside the gates 210. The partial spacers 222 have a thickness of, for example, approximately 2 nm to 25 nm.

Figure 7:
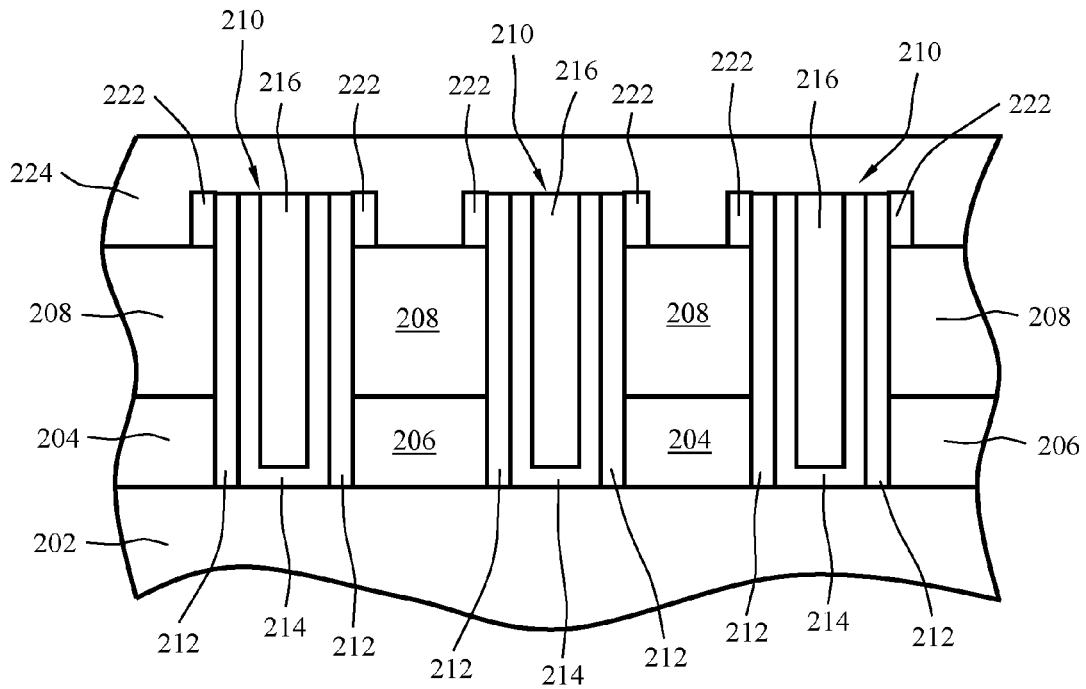
FIG. 7 depicts the structure of FIG. 6 after depositing an oxide layer, in accordance with one or more aspects of the present invention.
Figure 8:
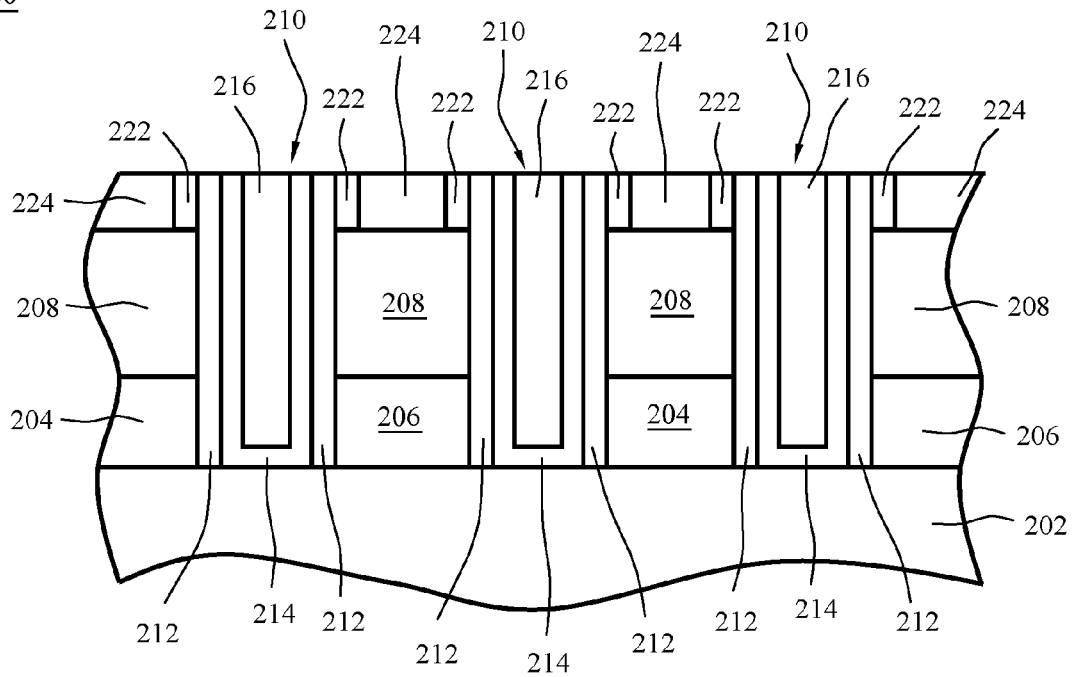
FIG. 8 depicts the structure of FIG. 7 after performing planarization on the device, in accordance with one or more aspects of the present invention.
Figure 9:
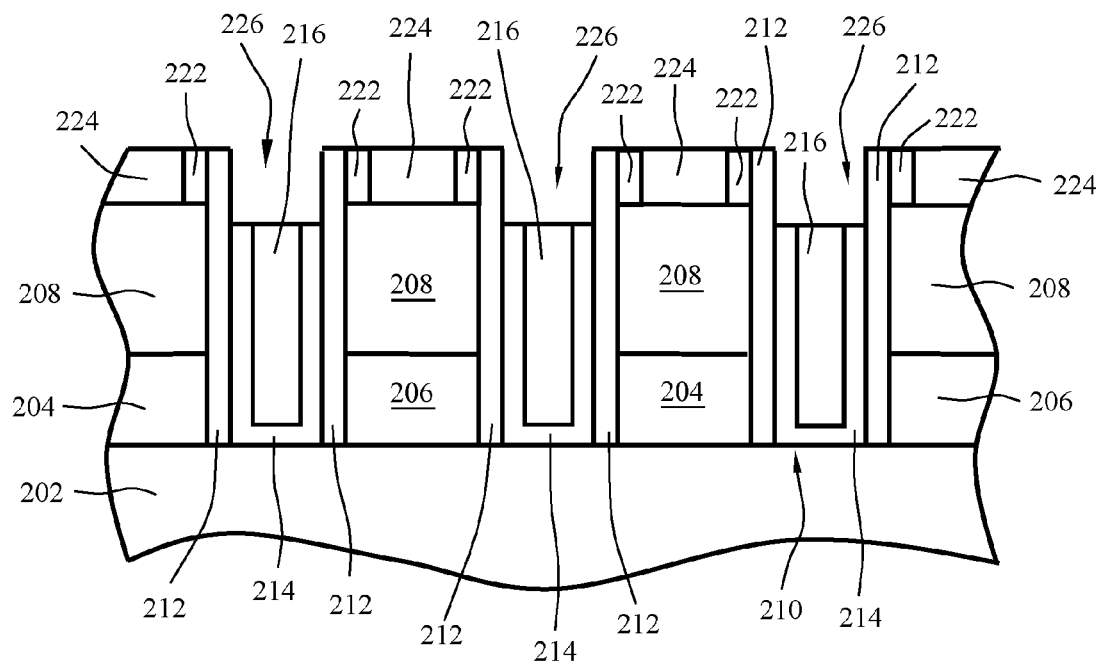
FIG. 9 depicts the structure of FIG. 8 after etching into the at least two gates, in accordance with one or more aspects of the present invention.
Figure 10:
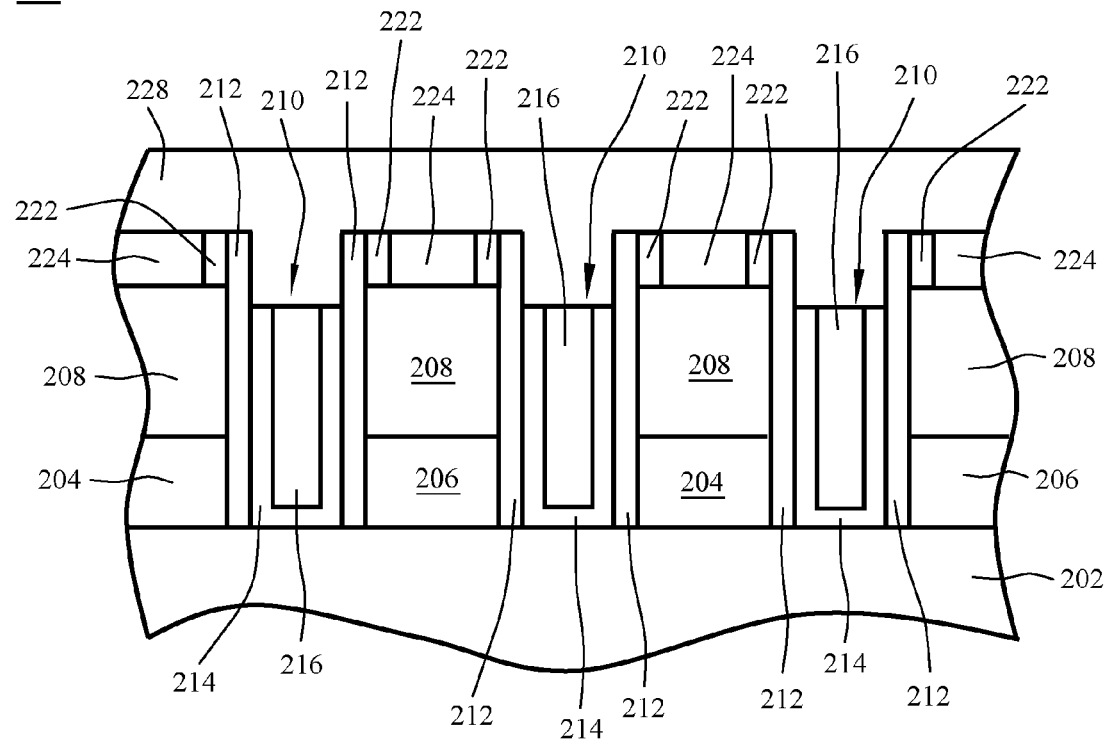
FIG. 10 depicts the structure of FIG. 9 after depositing a self-aligned contact layer, in accordance with one or more aspects of the present invention.

As shown in FIG. 7, an oxide layer 224 may be deposited over the device 200 to fill the space between the partial spacers 222. Next, the device 200 may be planarized by, for example, chemical mechanical planarization, as shown in FIG. 8. The planarization may be performed, for example, down to the partial spacers 222. Then the gates 210 of the device 200 may be partially etched between the spacers 212 to form openings 226, as shown in FIG. 9. Following the etching, as shown in FIG. 10, a self-aligned contact layer 228 may be applied over the device 200.

Figure 11:
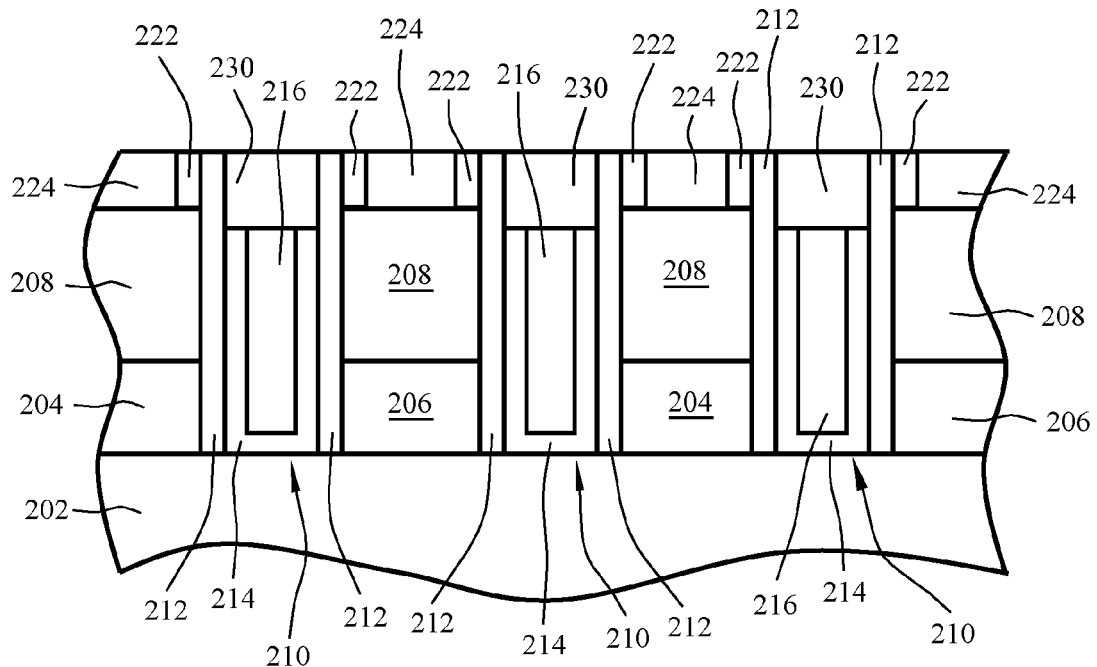
FIG. 11 depicts the structure of FIG. 10 after performing planarization on the device, in accordance with one or more aspects of the present invention.
Figure 12:
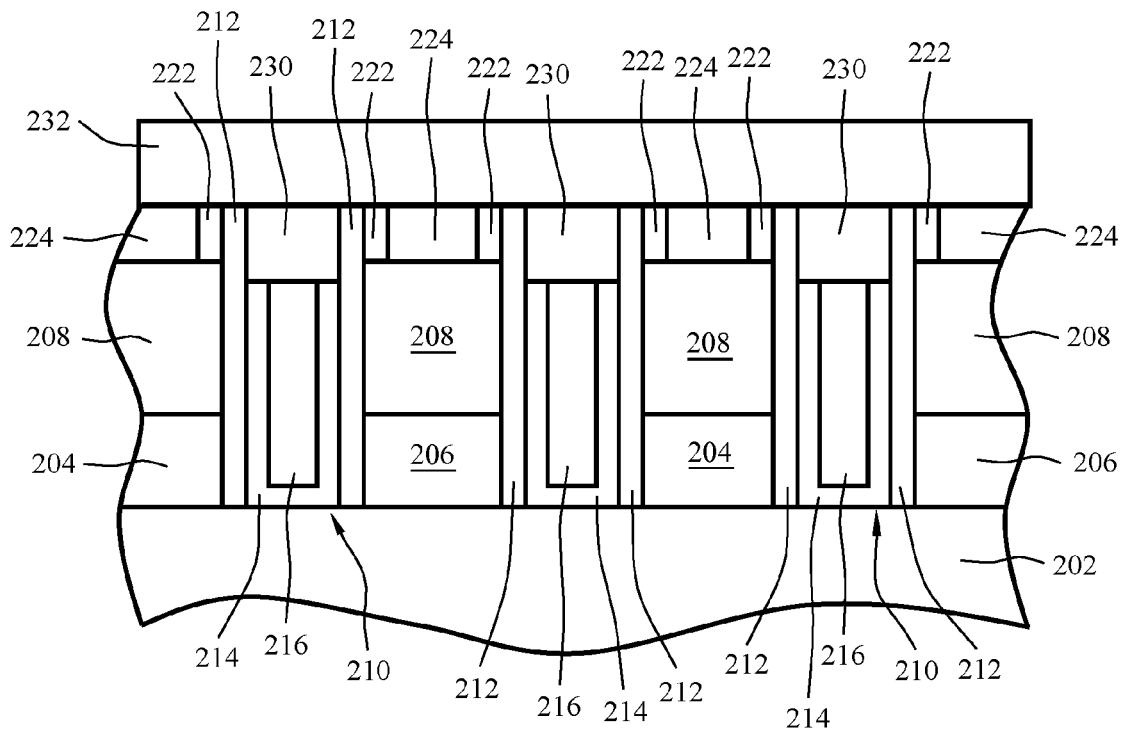
FIG. 12 depicts the structure of FIG. 11 after depositing an interlayer dielectric layer, in accordance with one or more aspects of the present invention.
Figure 13:
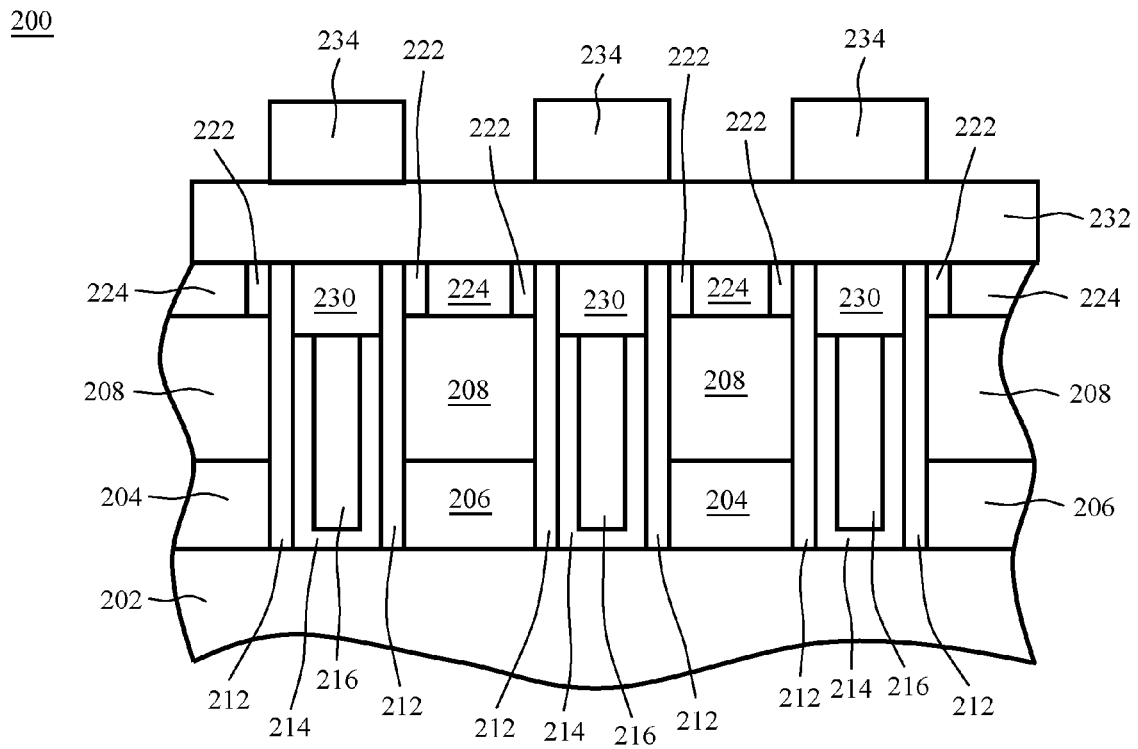
FIG. 13 depicts the structure of FIG. 12 after applying and patterning a photo resist layer, in accordance with one or more aspects of the present invention.
Figure 14:
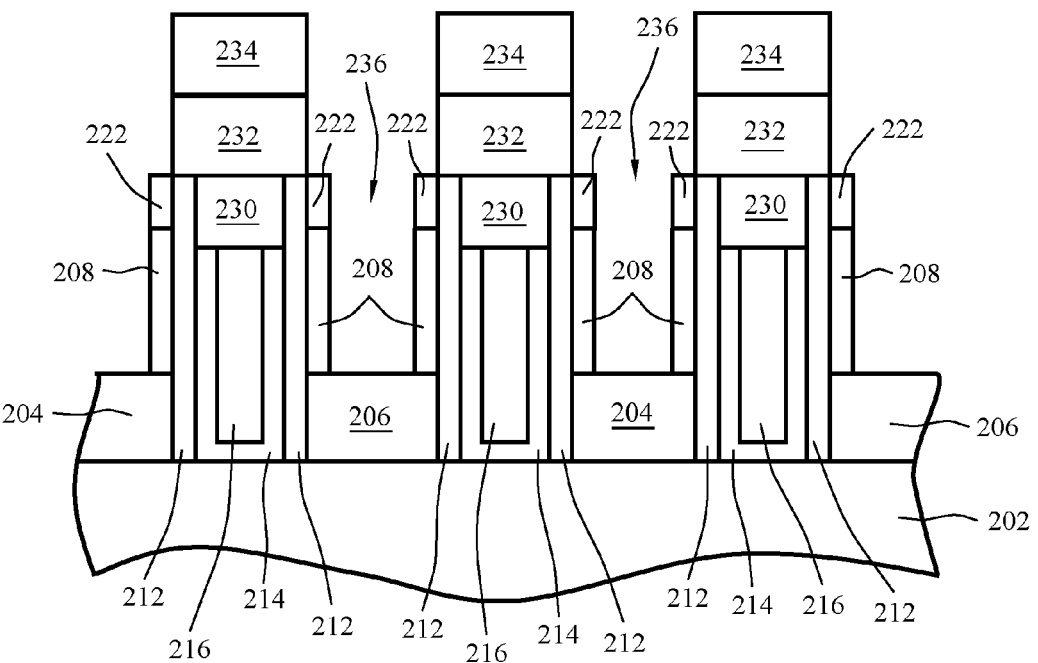
FIG. 14 depicts the structure of FIG. 13 after etching the interlayer dielectric layer and oxide layer, in accordance with one or more aspects of the present invention.

Next the device 200 may be planarized, as depicted in FIG. 11. The device 200 may be planarized by, for example, chemical mechanical planarization. The planarization of the device 200 may form self-aligned contacts 230 over the gates 210. The self-aligned contacts 230 may be, for example, silicon nitride (SiN) or another insulating material. Another oxide layer 232, for example, an interlayer dielectric layer, may then be applied over the device 200, as shown in FIG. 12. Then a photoresist layer 234 may be applied over the oxide layer 232 and patterned, as illustrated in FIG. 13. Next, as shown in FIG. 14, the device 200 may be etched to remove a portion of the oxide layers 208, 224, and 232 to form cavities 236. The cavities 236 may be positioned between the gates 210 and extend down to the source and drain regions 204, 206.

Figure 15:
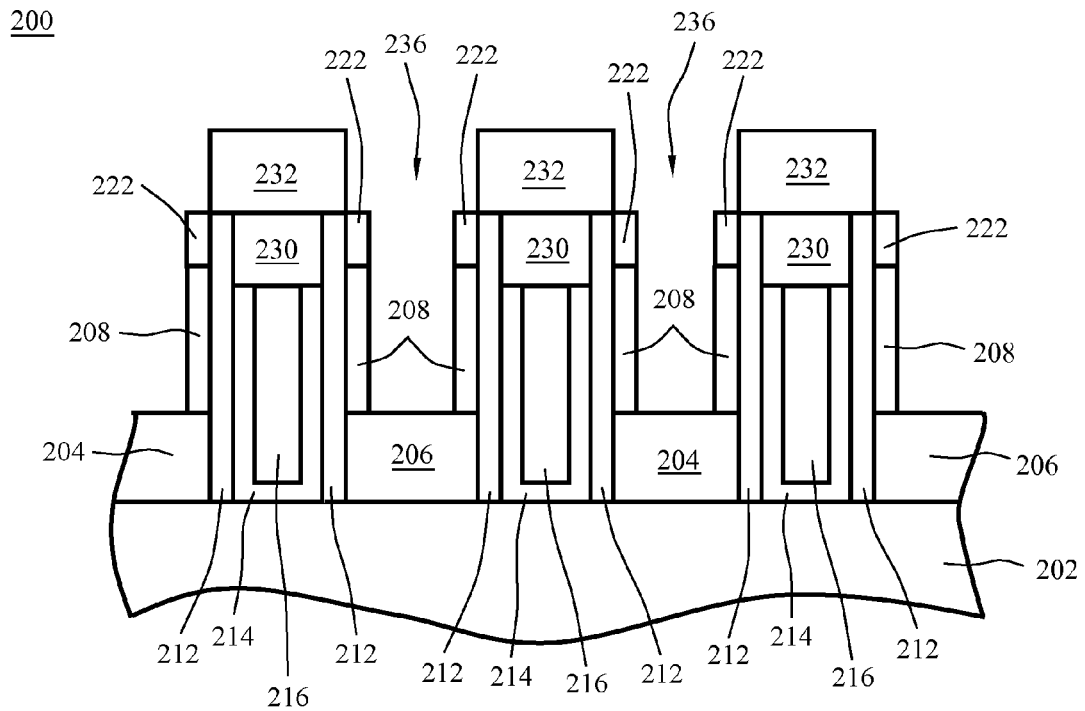
FIG. 15 depicts the structure of FIG. 14 after removing the photo resist layer, in accordance with one or more aspects of the present invention.
Figure 16:
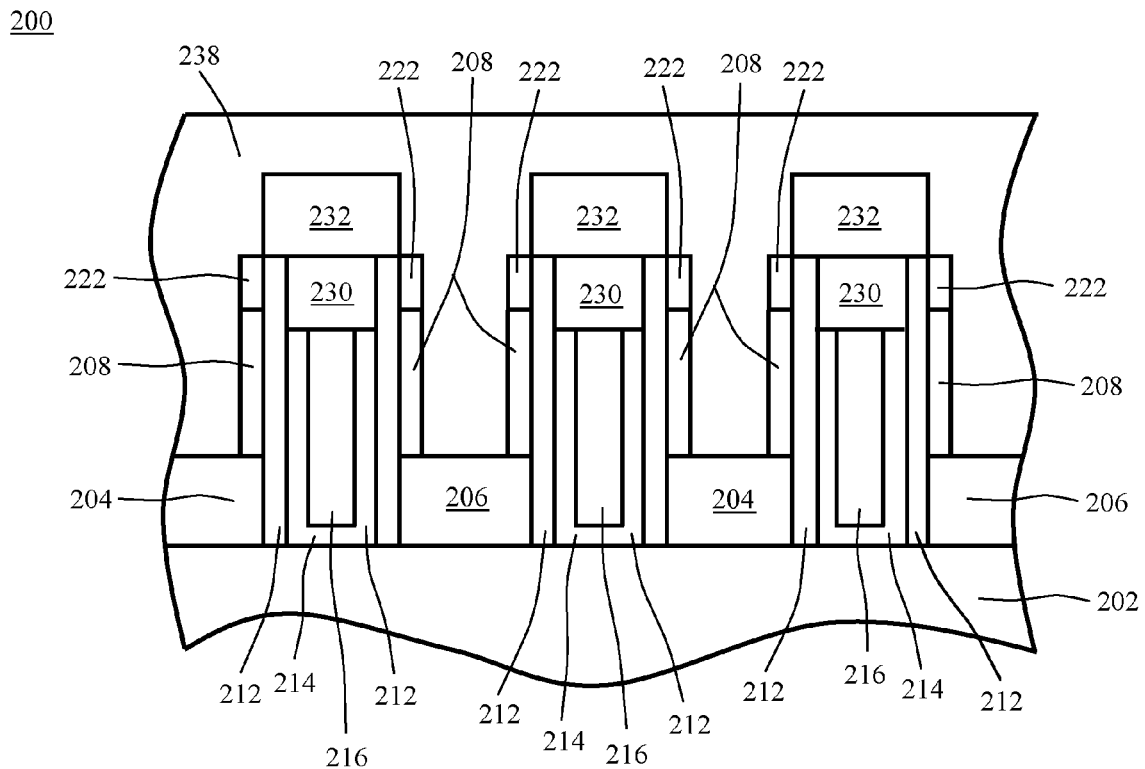
FIG. 16 depicts the structure of FIG. 15 after depositing a contact material, in accordance with one or more aspects of the present invention.
Figure 17:
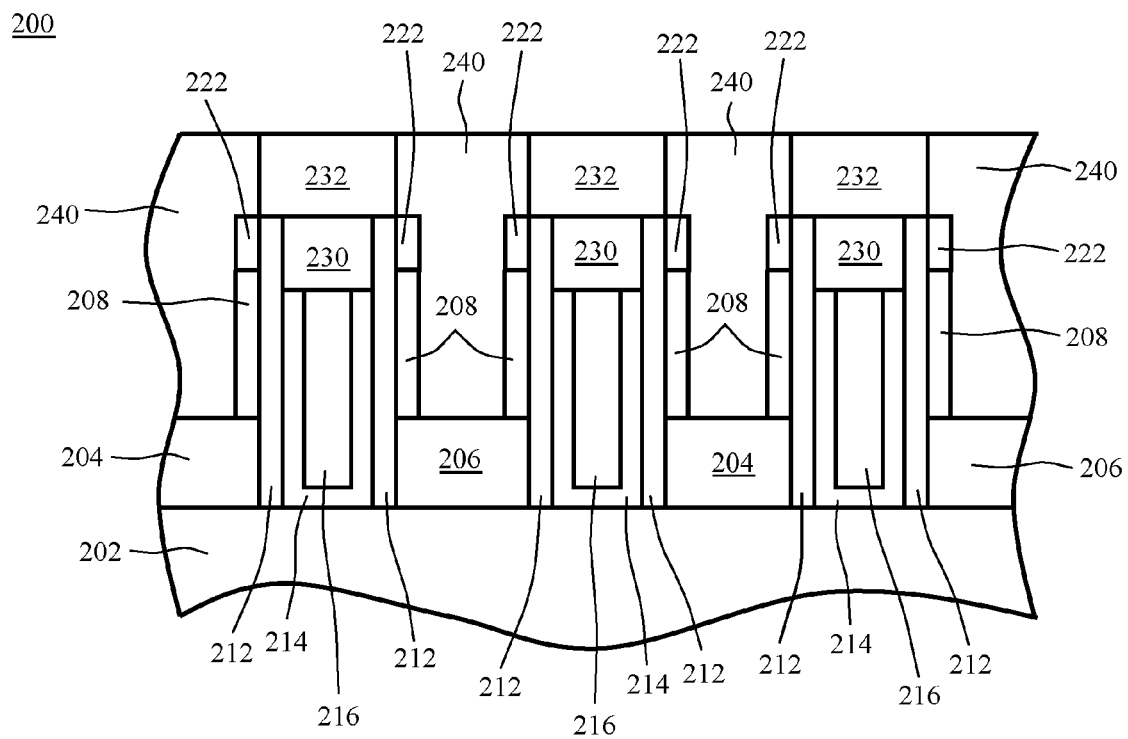
FIG. 17 depicts the structure of FIG. 16 after performing planarization on the device, in accordance with one or more aspects of the present invention.

The photoresist layer 234 may then be removed, as shown in FIG. 15. Next a contact material 238 may be deposited over the device 200, as depicted in FIG. 16. Then the device 200 may be planarized by, for example, chemical mechanical planarization, to remove the contact material 238 down to the oxide layer 232 to form contacts 240, as illustrated in FIG. 17. The final device may include partial spacers 222 and contacts 240 which extend over the partial spacers 222.

Figure 18:
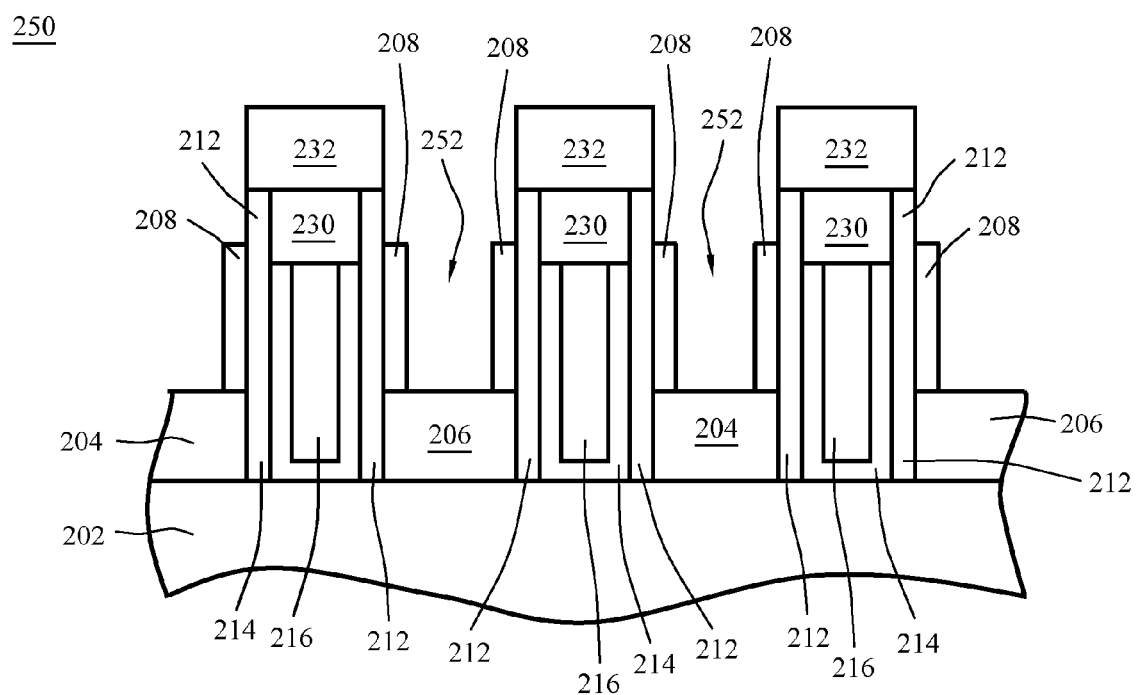
FIG. 18 depicts the structure of FIG. 15 after etching the partial spacers, in accordance with one or more aspects of the present invention.
Figure 19:
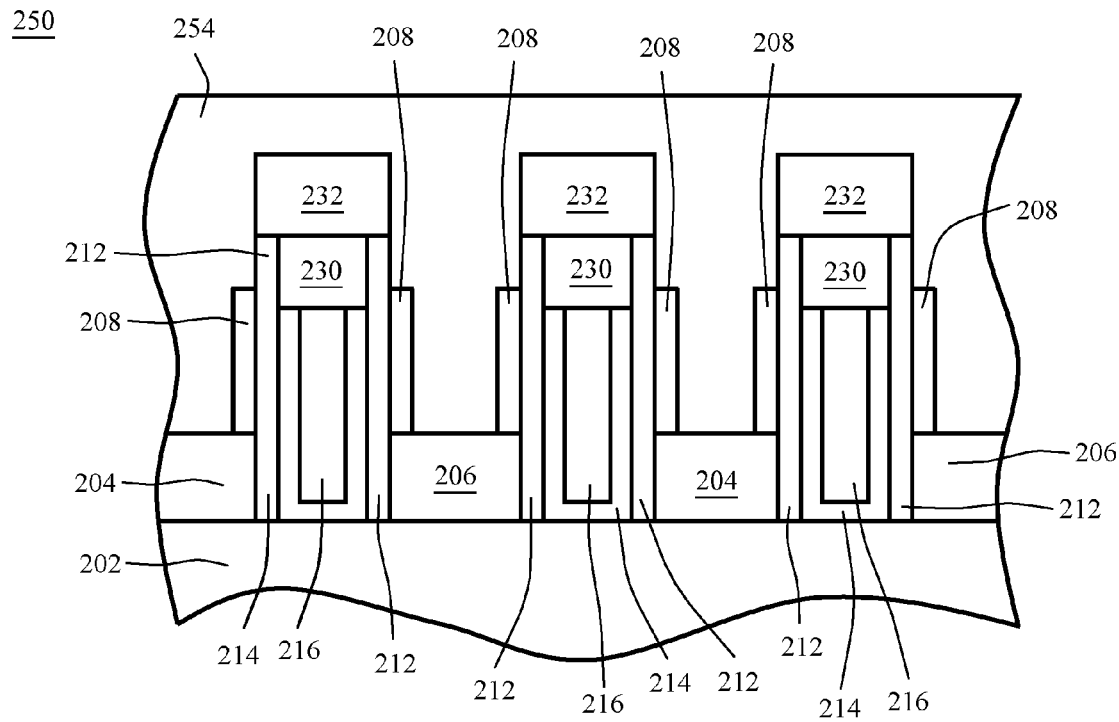
FIG. 19 depicts the structures of FIG. 18 after depositing the contact material, in accordance with one or more aspects of the present invention.
Figure 20:
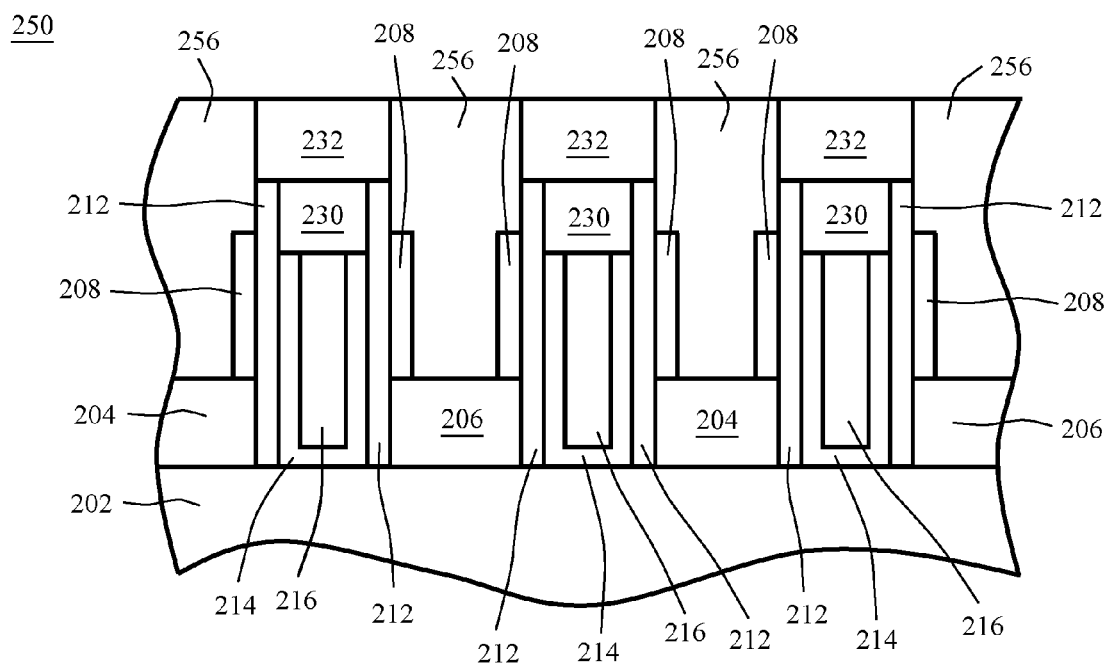
FIG. 20 depicts the structure of FIG. 19 after performing planarization on the device, in accordance with one or more aspects of the present invention.

FIGS. 18-20 show an alternative embodiment of the fabrication process or method of FIG. 1 for the semiconductor device 200 of FIGS. 3-15 which includes removing the partial spacers 222 before depositing the contact material 254. As described in greater detail above, the device 200 may have been processed through the steps shown in FIGS. 3-15. The device 200 of FIG. 15, may then be etched to remove the partial spacers 222 and to form cavities 252 between the gates 210, as shown in FIG. 18, to form an intermediate semiconductor device 250. Then a contact material 254 may be deposited over the device 250, as depicted in FIG. 19. The device 250 may then be planarized by, for example, chemical mechanical planarization, to remove the contact material 254 down to the oxide layer 232 to form contacts 256, as illustrated in FIG. 20. The final device 250 may include contacts 256 that are narrower near the at least one source region 204 and at least one drain region 206 and wider near the top of the device 250.

An alternative fabrication process or method of forming partial spacers on a semiconductor device 300 is shown in FIGS. 21-34. By way of example only, one detailed embodiment of a portion of a FinFET device formation process of FIG. 2 on a portion of an intermediate FinFET structure, in accordance with one or more aspects of the present invention, is depicted in FIGS. 21-34. Note again that these figures are not drawn to scale in order to facilitate understanding of the invention, and that the same reference numerals are used throughout different figures to designate the same or similar elements.

Figure 21:
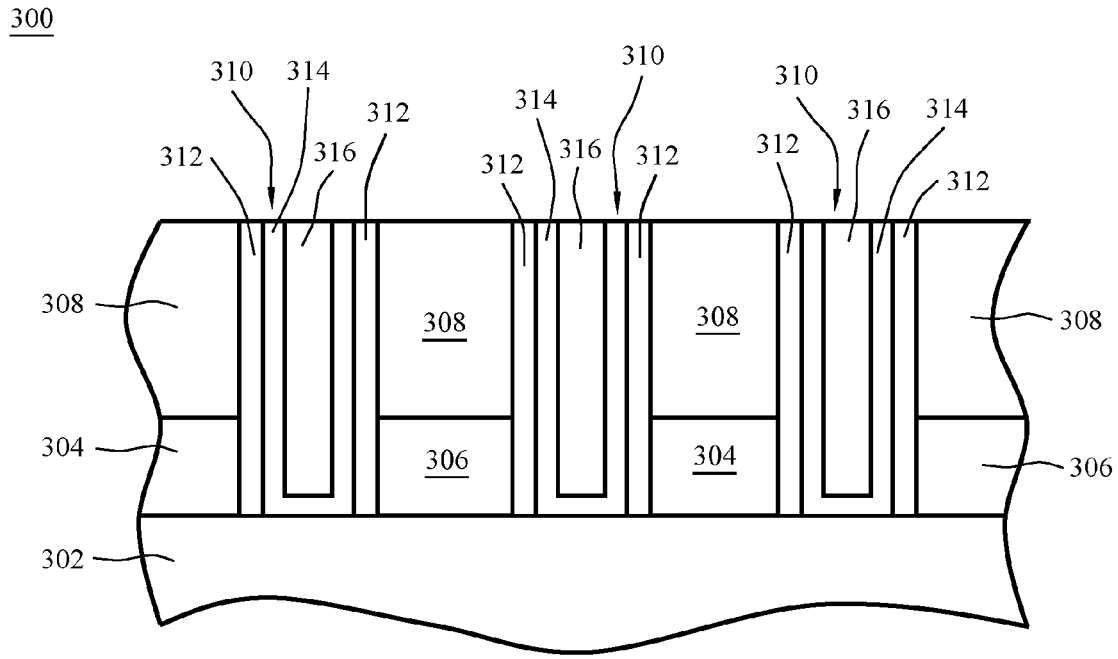
FIG. 21 depicts a cross-sectional elevation view of another semiconductor device with at least two gates formed on a wafer, in accordance with one or more aspects of the present invention.

FIG. 21 shows a portion of semiconductor device 300 obtained during the fabrication process. The device 300 may have been processed through initial device processing steps in accordance with the design of the device 300 being fabricated, for example, the device 300 may include, for example, an isolation region 302, at least one source region 304, at least one drain region 306, and at least one gate 310. The at least one source region 304, at least one drain region 306, and at least one gate 310 are positioned over the isolation region 302. The at least one source region 304 and at least one drain region 306 may be, for example, embedded silicon germanium (eSiGe) for pFETs or embedded silicon phosphorus (eSiP) for nFETs. The device 300 may also include an oxide layer 308 surrounding or positioned between the at least one gate 310. The at least one gate 310 may be separated from the oxide layer 308 by spacers 312. In addition, the at least one gate 310 may include, for example, at least one work function metal 314 and a gate metal 316.

Figure 22:
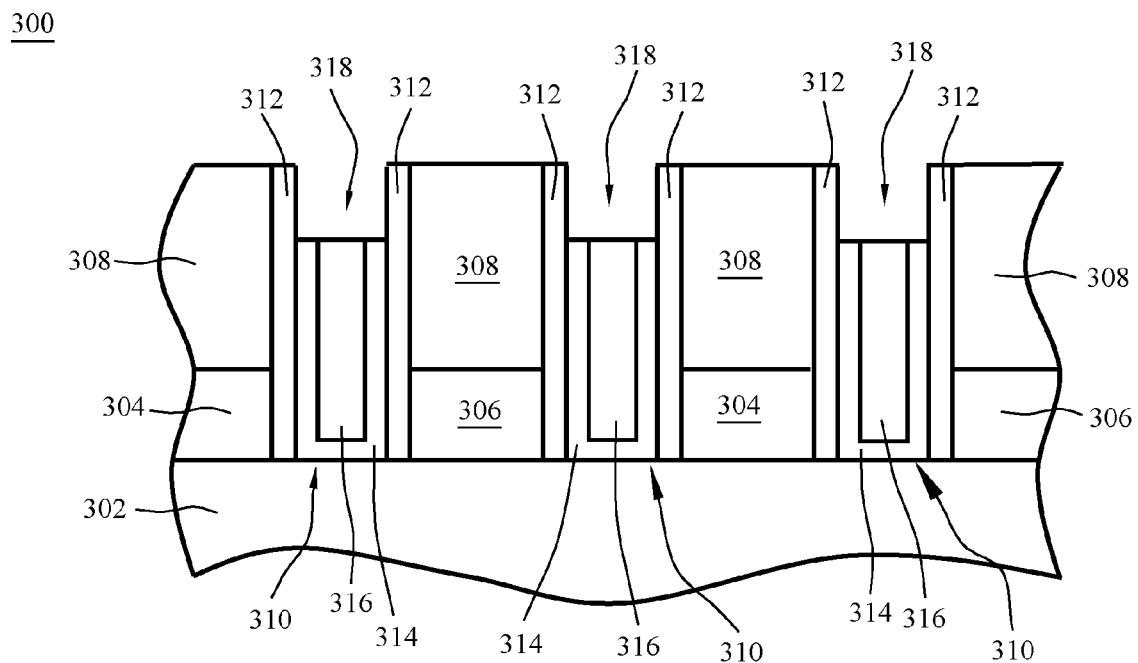
FIG. 22 depicts the structure of FIG. 21 after etching into the at least two gates, in accordance with one or more aspects of the present invention.
Figure 23:
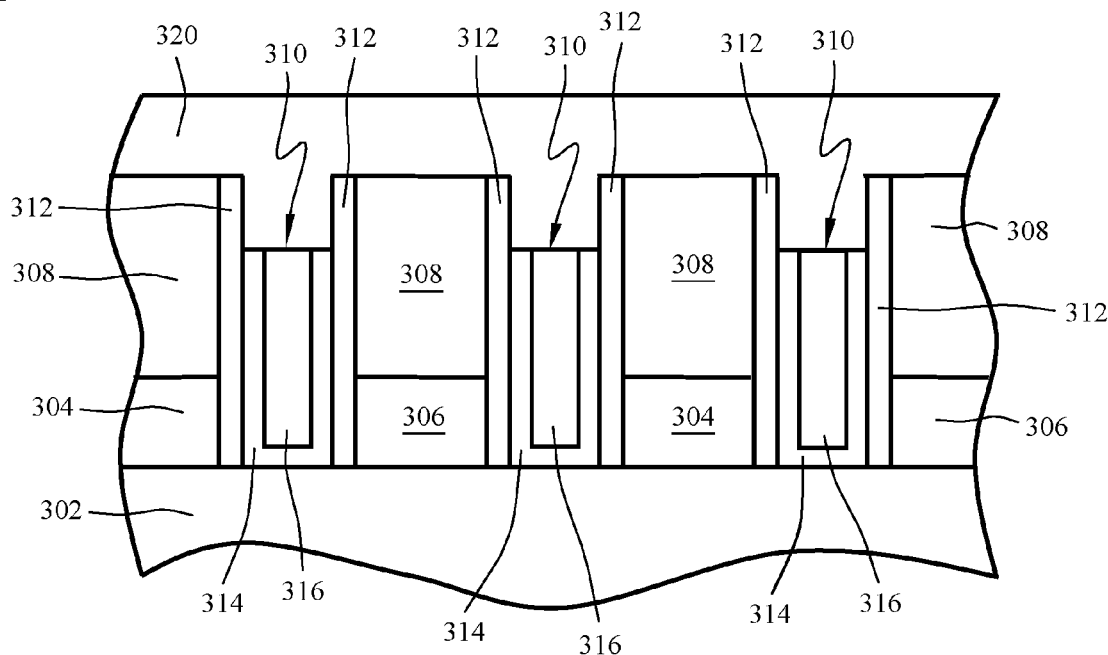
FIG. 23 depicts the structure of FIG. 22 after depositing a self-aligned contact layer, in accordance with one or more aspects of the present invention.
Figure 24:
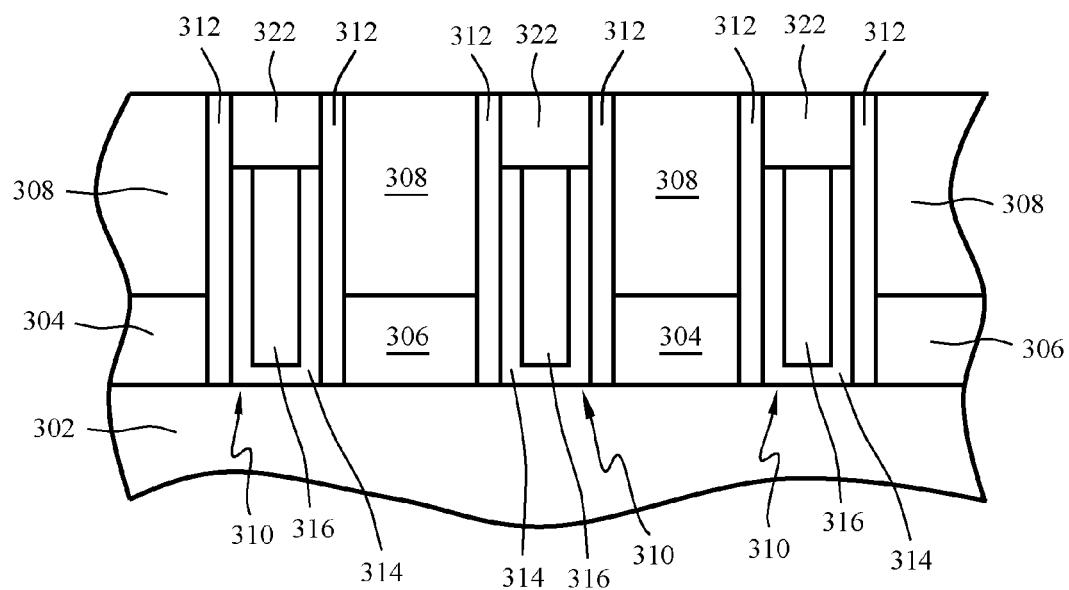
FIG. 24 depicts the structure of FIG. 23 after performing planarization on the device, in accordance with one or more aspects of the present invention.
Figure 25:
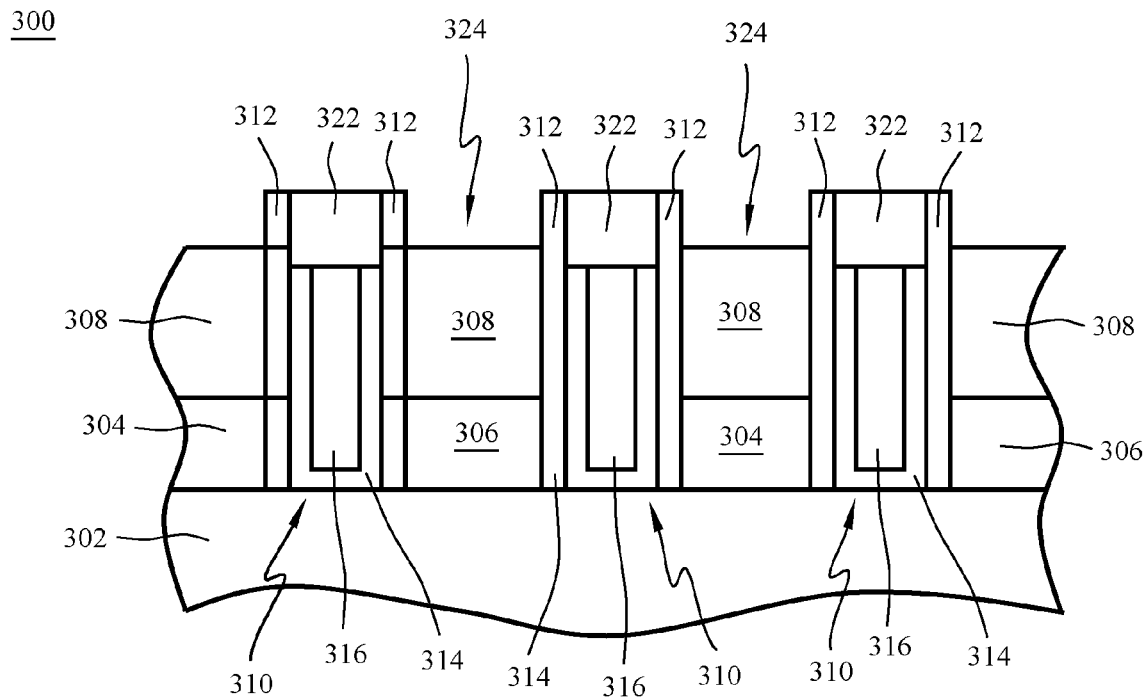
FIG. 25 depicts the structure of FIG. 24 after etching the oxide layer, in accordance with one or more aspects of the present invention.

As depicted in FIG. 22, the at least one work function metal 314 and gate metal 316 of the at least one gate 310 may be partially etched to form cavities 318 over the gates 310. Then a self-aligned contact layer 320 may be applied over the device 300, as illustrated in FIG. 23. Next the device 300 may be planarized by, for example, chemical mechanical planarization, to form self-aligned contacts 322 over the gates 310, as shown in FIG. 24. Following planarization, the device 300 may be etched to remove a portion of the oxide layer 308 and form cavities 324. The etching of the oxide layer 308 may be, for example, a dry etch or a wet etch. The cavities 324 may have a depth below the top surface of the self-aligned contacts 322 of, for example, approximately 5 nm to 100 nm and, more specifically, approximately 15 nm to 45 nm.

Figure 26:
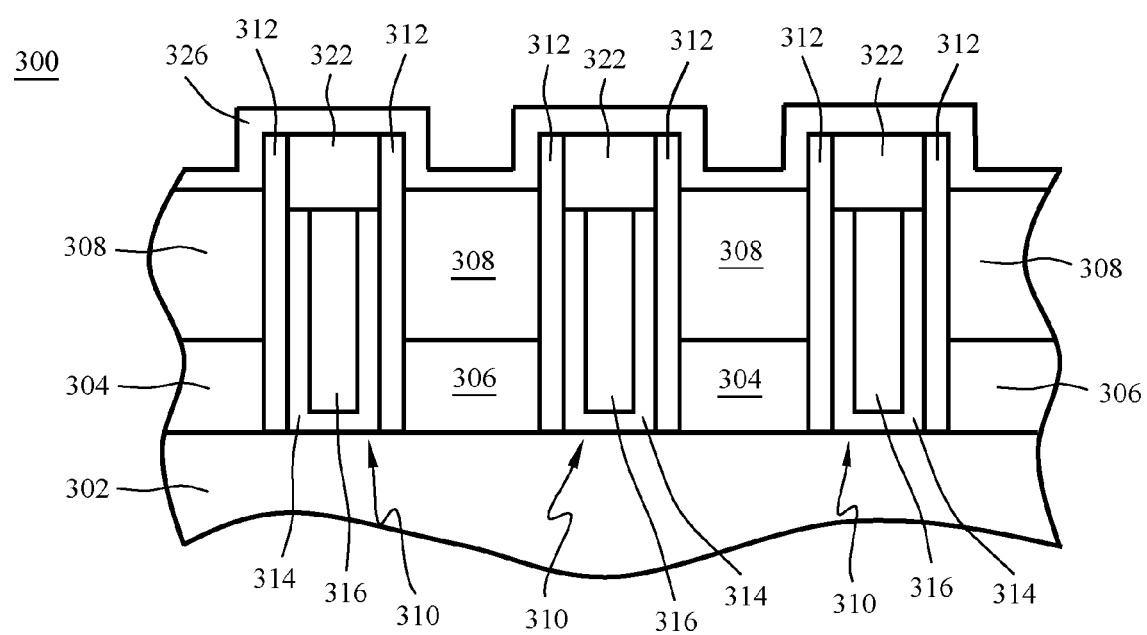
FIG. 26 depicts the structure of FIG. 25 after depositing a spacer layer, in accordance with one or more aspects of the present invention.
Figure 27:
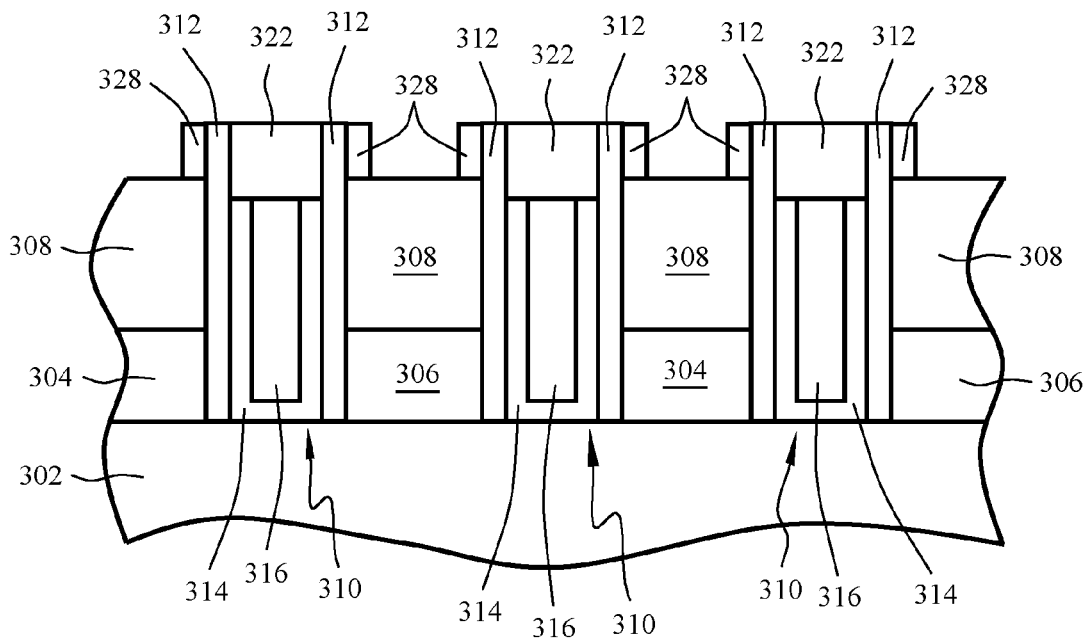
FIG. 27 depicts the structure of FIG. 26 after etching the partial spacer layer to form partial spacers, in accordance with one or more aspects of the present invention.

Next a spacer layer 326 may be deposited over the device 300, as shown in FIG. 26. The spacer layer 326 may be, for example, a material with an etch selectivity to oxide, such as, SiN, SiCO, another low κ material, a high κ material, or a metal. Then the spacer layer 326 may be etched to form a plurality of partial spacers 328, as shown in FIG. 27. The partial spacers 328 may be positioned next to the spacers 312 outside the gates 310. The partial spacers 328 have a thickness of, for example, approximately 2 nm to 25 nm.

Figure 28:
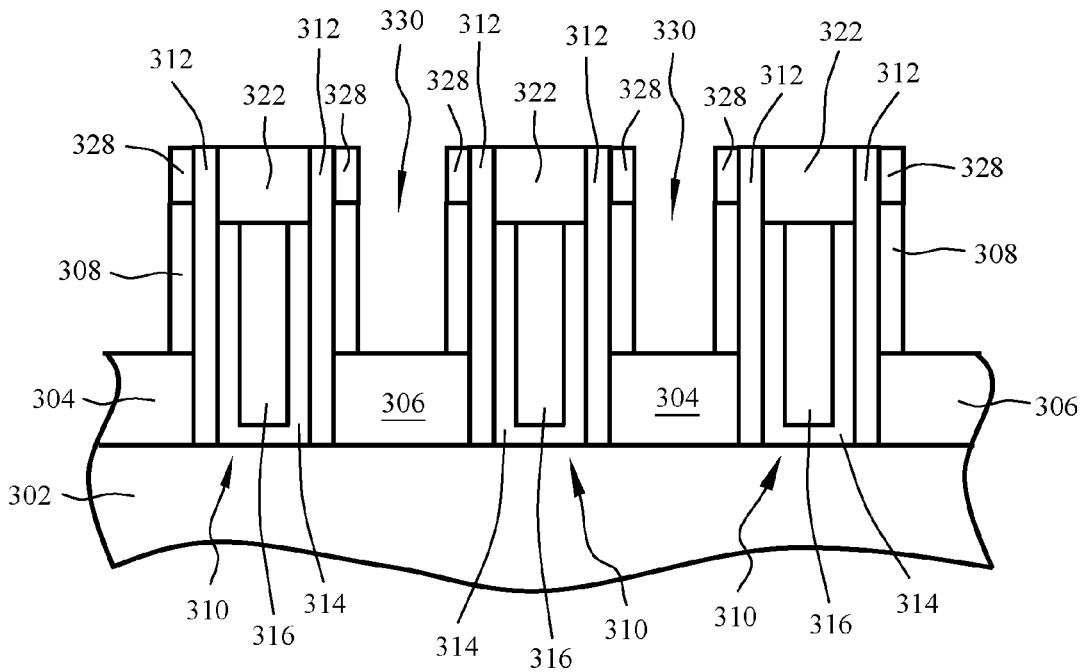
FIG. 28 depicts the structure of FIG. 27 after etching into the oxide layer, in accordance with one or more aspects of the present invention.

Once the partial spacers 328 are formed, a direct etch may be performed to form cavities 330, as shown in FIG. 28. Alternatively, after the partial spacers 328 are formed, a photoresist layer may be applied over the device 300 and patterned. Then, as shown in FIG. 28, the device 300 may be etched to remove a portion of the oxide layers 308 to form cavities 330 and the photoresist layer may be removed. It is also contemplated that an interlayer dielectric layer, for example, an oxide layer, may be deposited over the device 300 to fill the space between the partial spacers 328. Next, the device 300 may be planarized by, for example, chemical mechanical planarization. The planarization may be performed, for example, down to the partial spacers 328. Then a photoresist layer may be applied over the oxide layer and patterned. Next, as shown in FIG. 28, the device 300 may be etched to remove a portion of the oxide layers 308 to form cavities 330 and the photoresist layer may be removed. The cavities 330 may be positioned between the gates 310 and extend down to the source and drain regions 304, 306.

Figure 29:
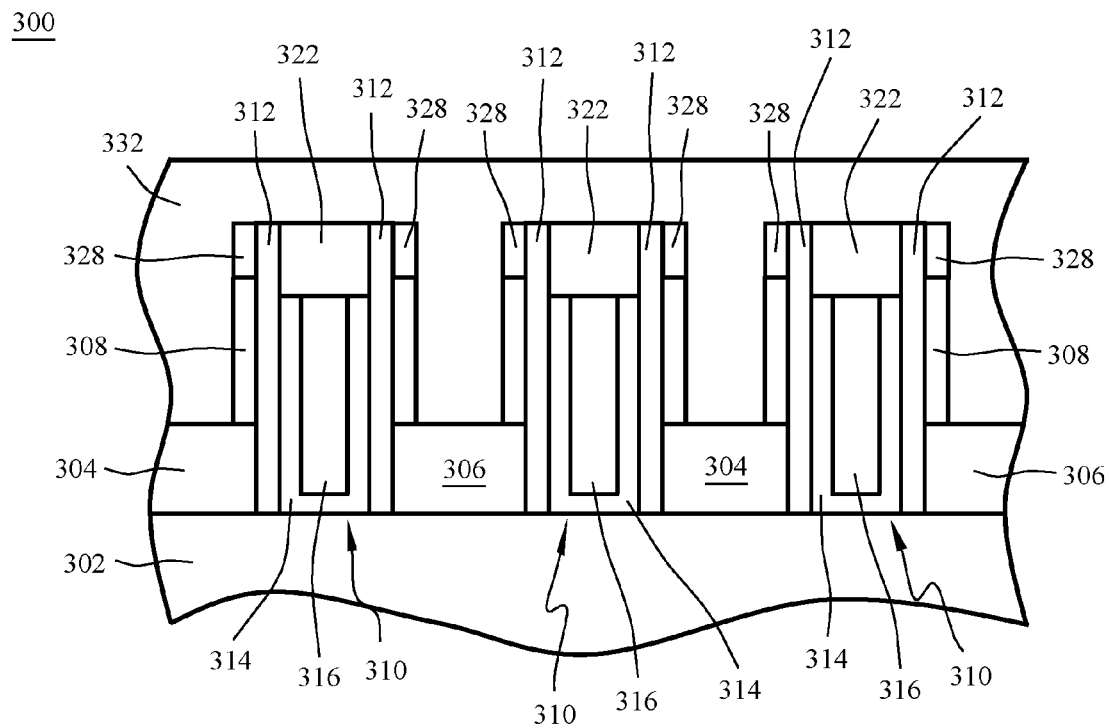
FIG. 29 depicts the structure of FIG. 28 after depositing a contact material, in accordance with one or more aspects of the present invention.
Figure 30:
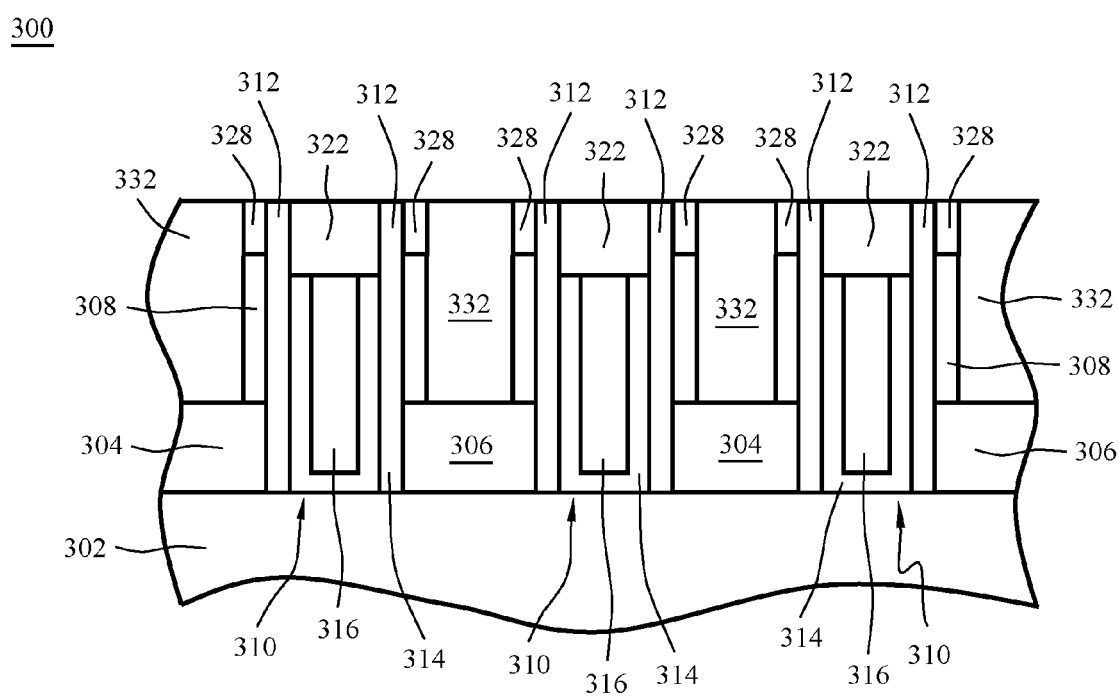
FIG. 30 depicts the structure of FIG. 29 after performing planarization of the device, in accordance with one or more aspects of the present invention.
Figure 31:
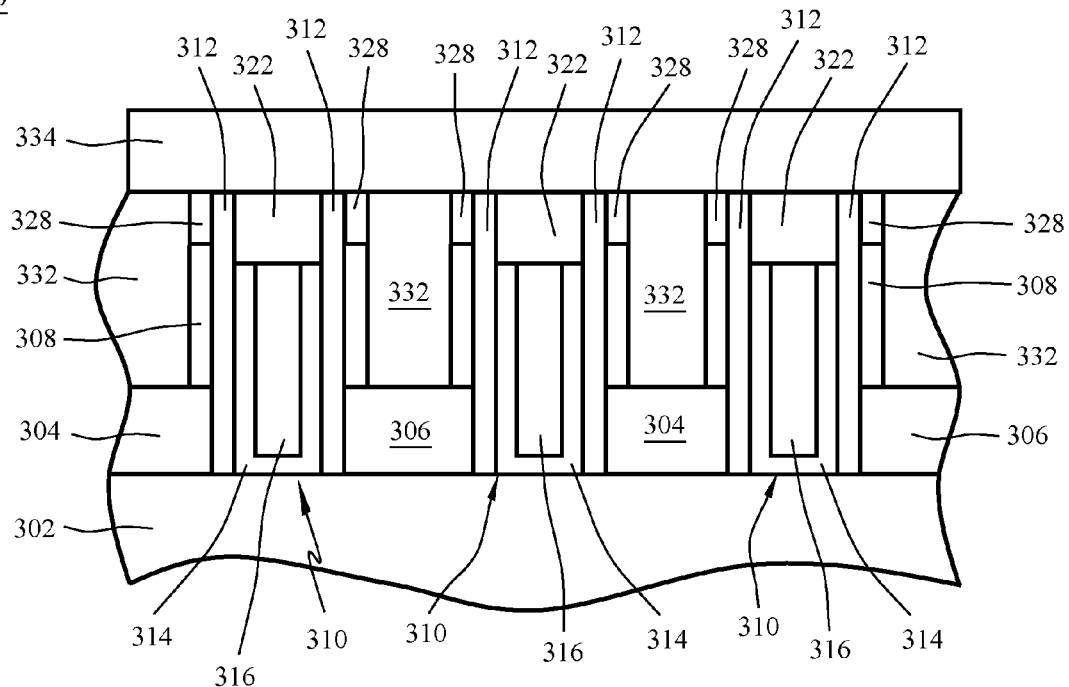
FIG. 31 depicts the structure of FIG. 30 after depositing a second oxide layer, in accordance with one or more aspects of the present invention.
Figure 32:
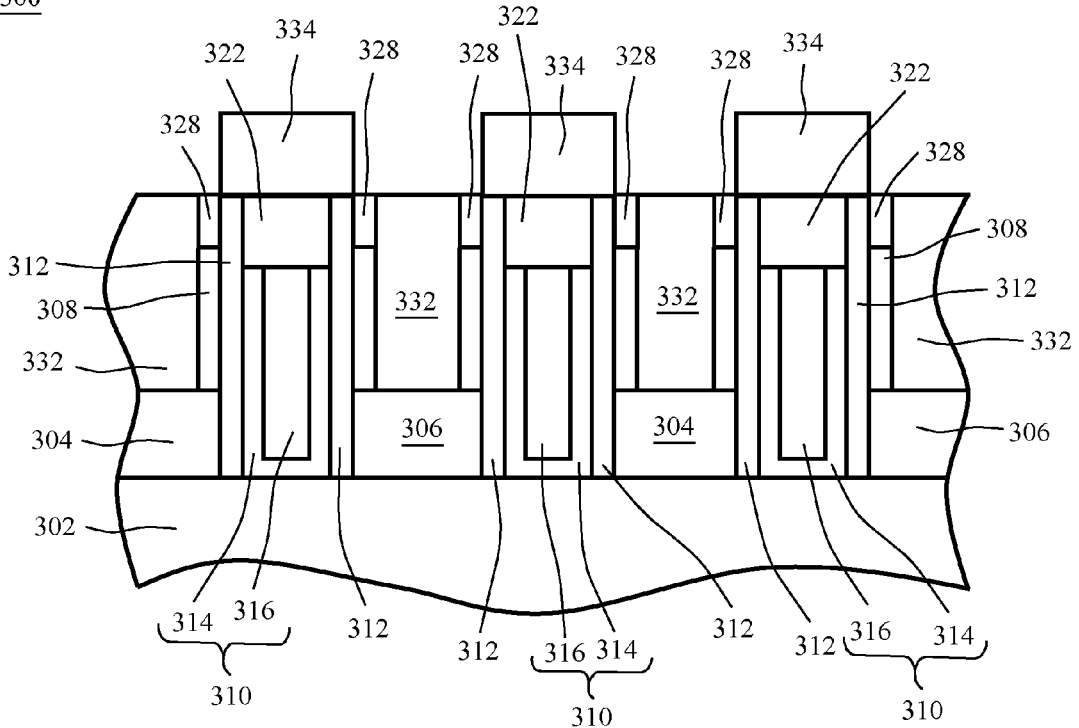
FIG. 32 depicts the structure of FIG. 31 after patterning the oxide layer, in accordance with one or more aspects of the present invention.
Figure 33:
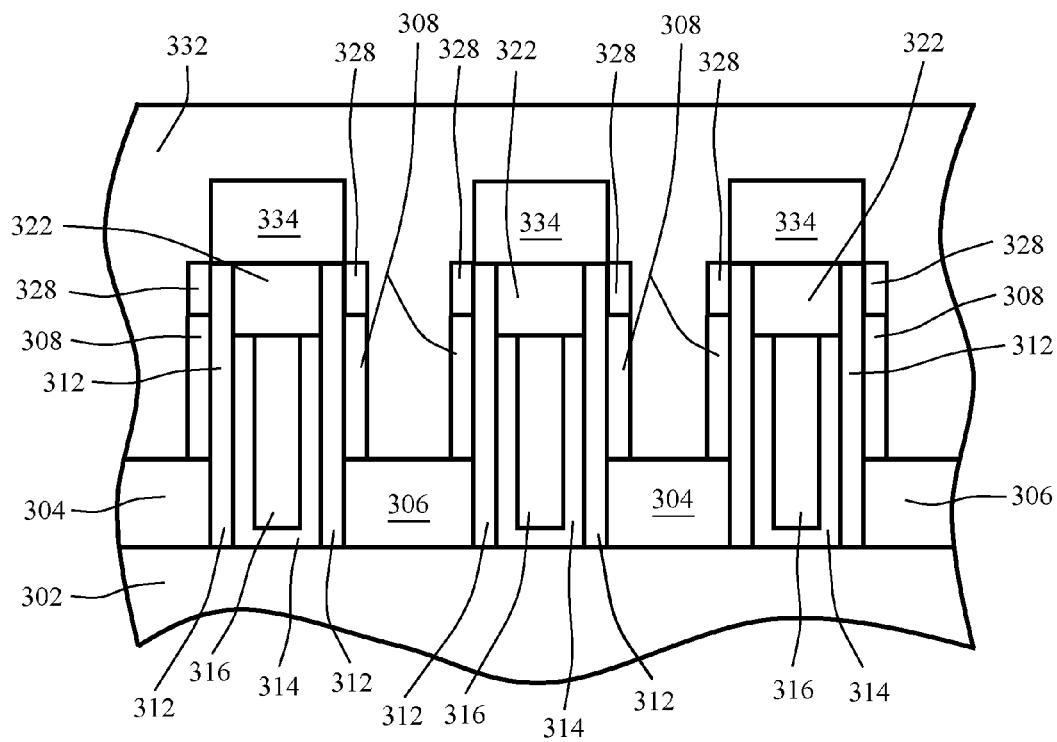
FIG. 33 depicts the structure of FIG. 32 after depositing a second layer of contact material, in accordance with one or more aspects of the present invention.
Figure 34:
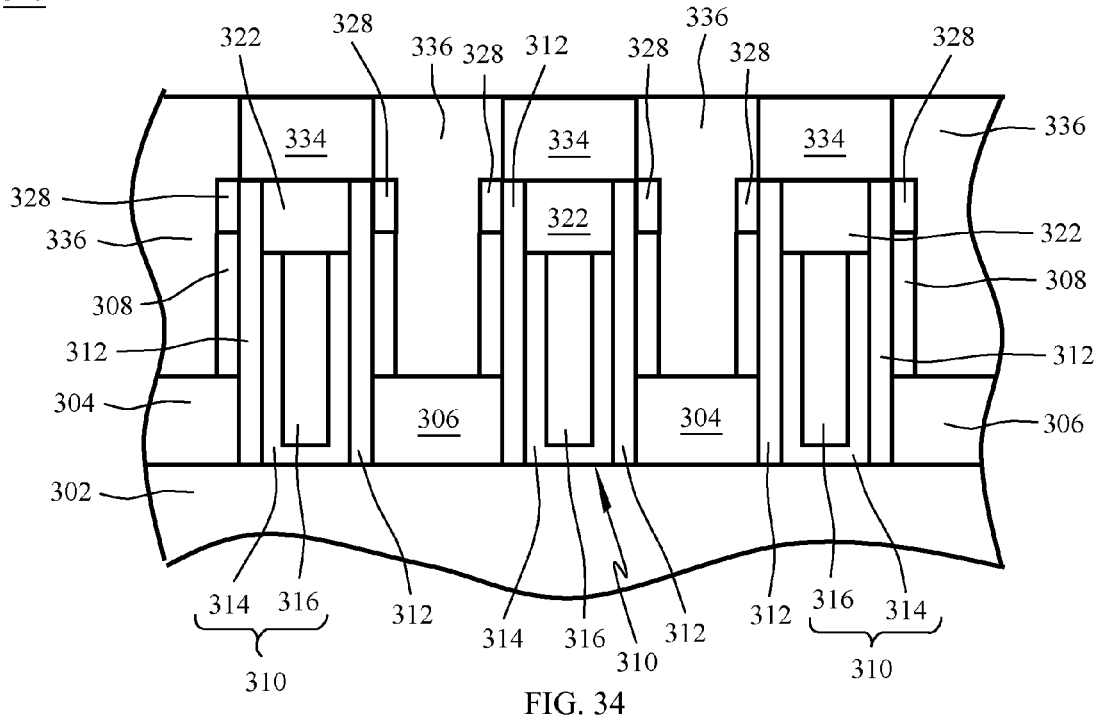
FIG. 34 depicts the structure of FIG. 33 after performing planarization of the device, in accordance with one or more aspects of the present invention.

Next a contact material 332 may be deposited over the device 300, as depicted in FIG. 29. Then the device 300 may be planarized by, for example, chemical mechanical planarization, to remove the contact material 332 down to the self-aligned contacts 322, as shown in FIG. 30. An oxide layer 334 may then be applied over the device 300, as shown in FIG. 31. The oxide layer 334 may then be patterned, as shown in FIG. 32, to enable formation of a second contact layer. The second contact layer may be formed by depositing a second layer of contact material 332 over the device 300, as illustrated in FIG. 33. Finally, as shown in FIG. 34, the device 300 may be planarized by, for example, chemical mechanical planarization, to remove the excess contact material 332 and form contacts 336. The final device 300 may include the partial spacers 328 and contacts 336 which extend over the partial spacers 328.

Figure 35:
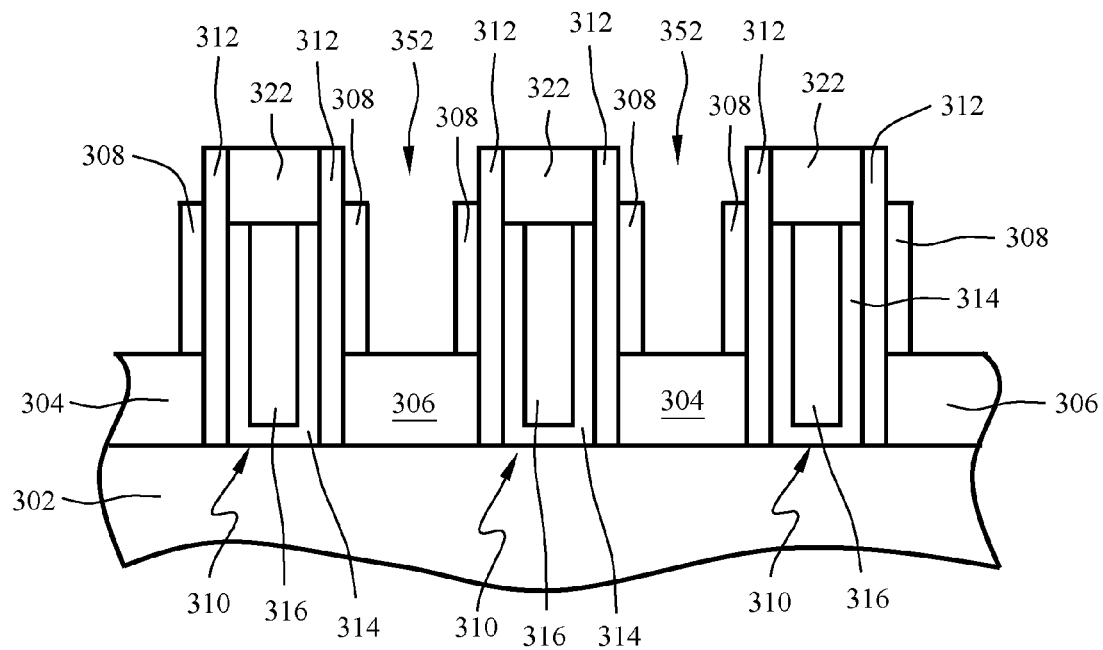
FIG. 35 depicts the structure of FIG. 28 after etching to remove the partial spacers, in accordance with one or more aspects of the present invention.

FIGS. 35-41 show an alternative embodiment of the fabrication process or method for the semiconductor device 300 of FIGS. 21-34 which includes removing the partial spacers 328 before depositing the contact material 332. As described in greater detail above, the device 300 may have been processed through the steps shown in FIGS. 21-28. The device 300 of FIG. 28, may be etched to remove the partial spacers 328 and to form cavities 352 between the gates 310, as shown in FIG. 35, to form an intermediate semiconductor device 350.

Figure 36:
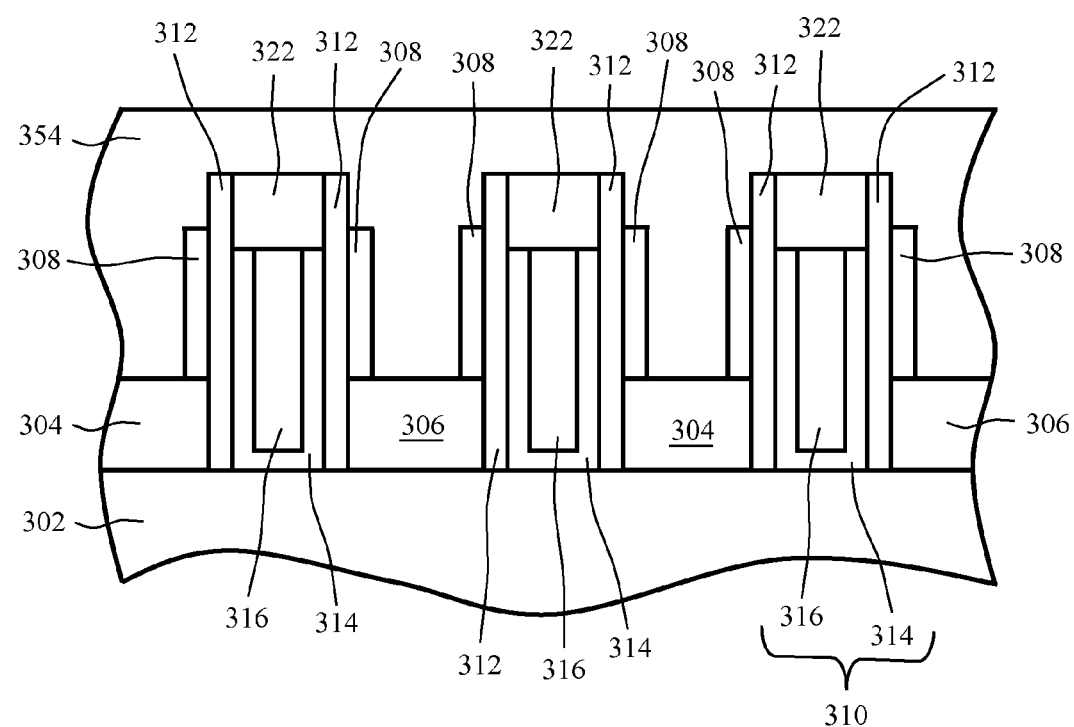
FIG. 36 depicts the structure of FIG. 35 after depositing a contact material, in accordance with one or more aspects of the present invention.
Figure 37:
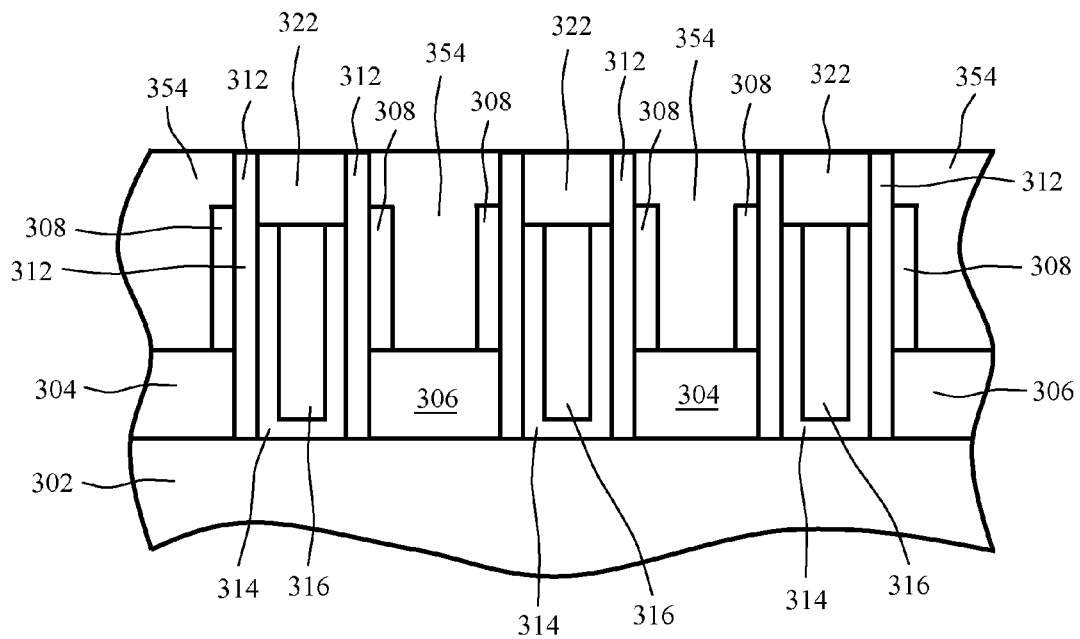
FIG. 37 depicts the structure of FIG. 36 after performing planarization of the device, in accordance with one or more aspects of the present invention.
Figure 38:
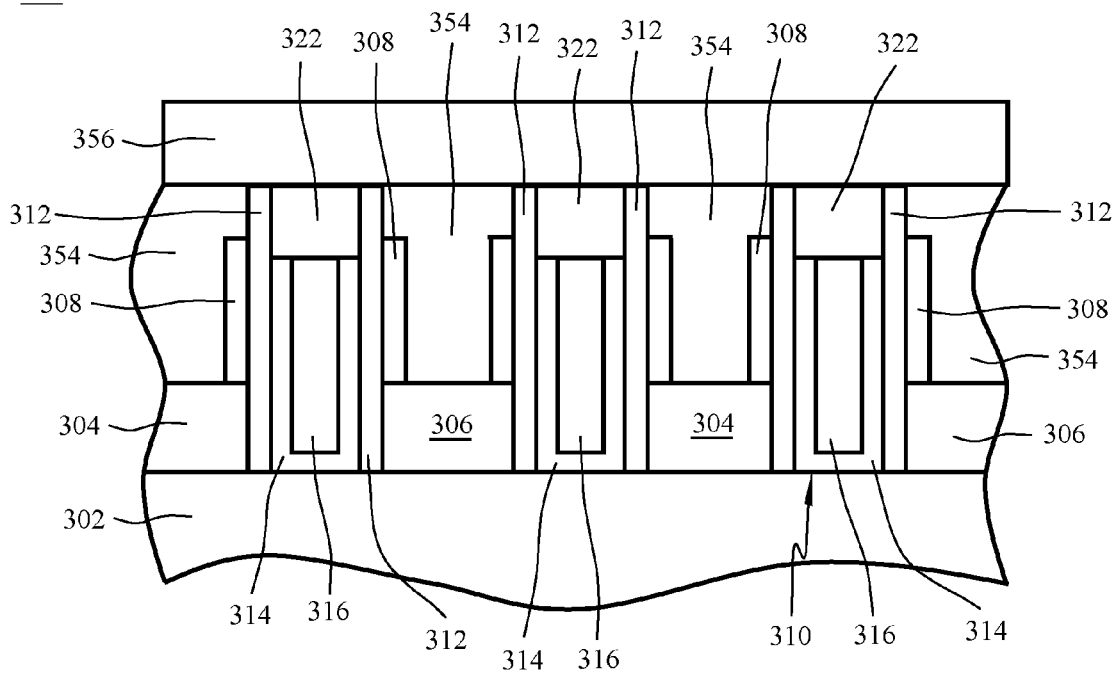
FIG. 38 depicts the structure of FIG. 37 after depositing a second oxide layer, in accordance with one or more aspects of the present invention.
Figure 39:
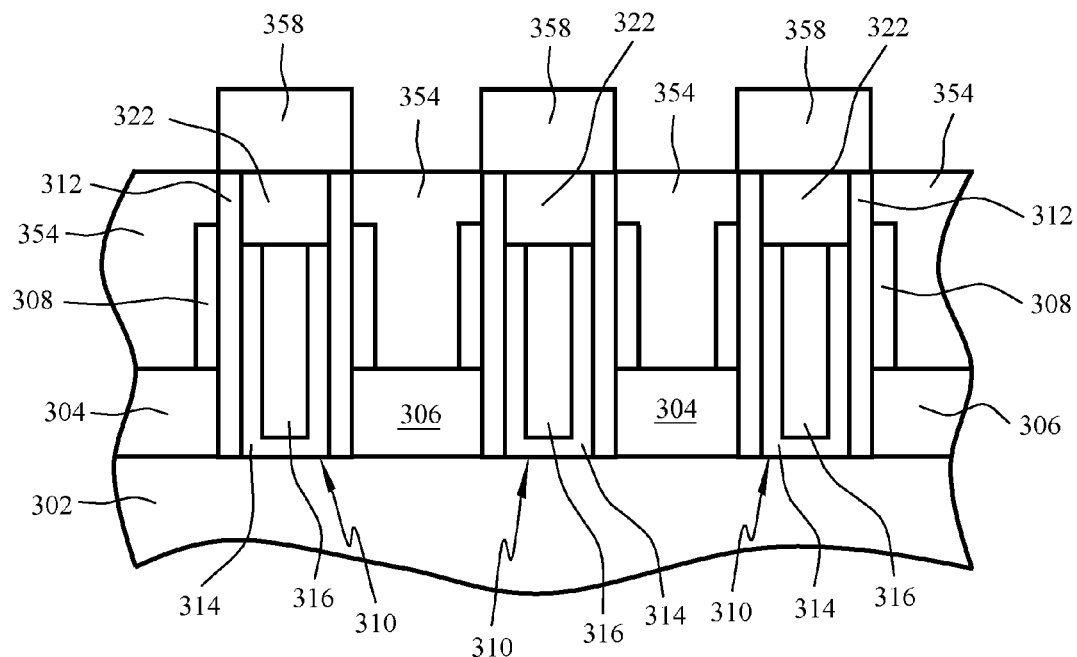
FIG. 39 depicts the structure of FIG. 38 after patterning the second oxide layer, in accordance with one or more aspects of the present invention.
Figure 40:
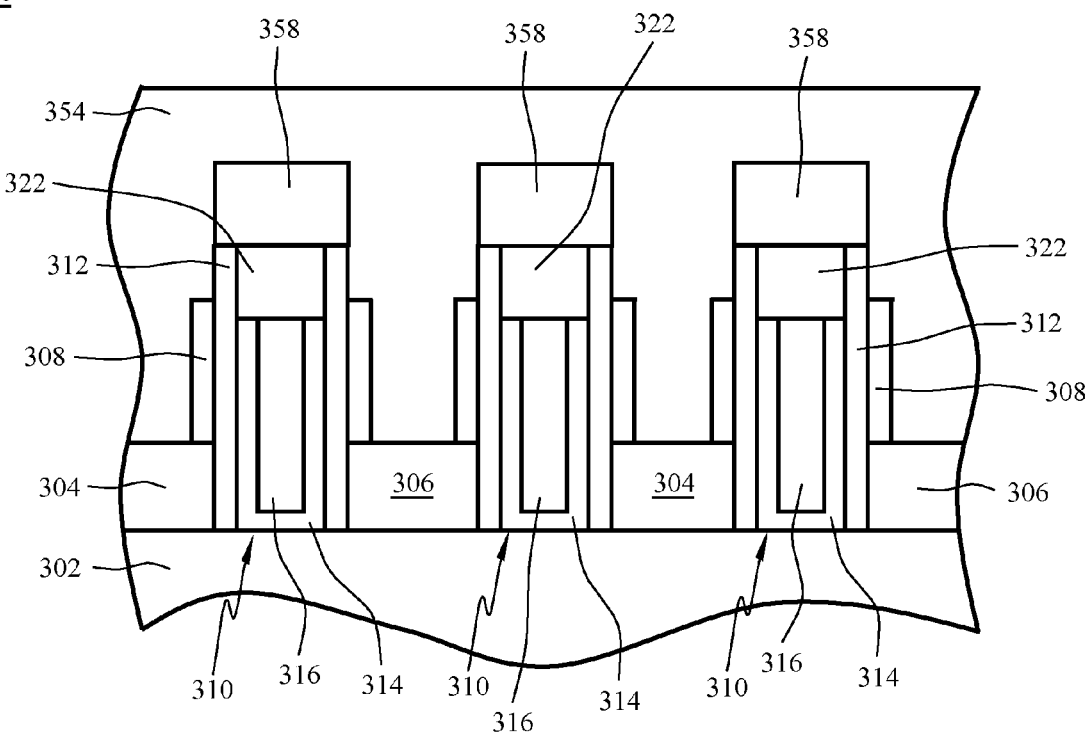
FIG. 40 depicts the structure of FIG. 39 after depositing a second layer of contact material, in accordance with one or more aspects of the present invention.
Figure 41:
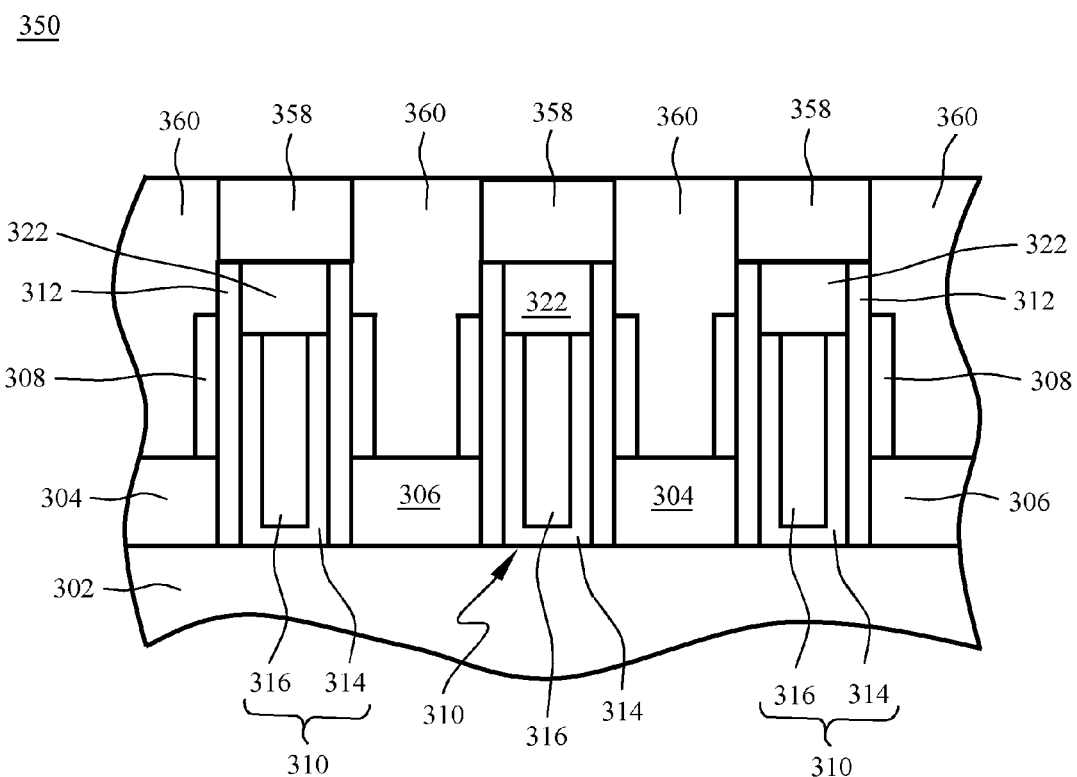
FIG. 41 depicts the structure of FIG. 40 after performing planarization of the device, in accordance with one or more aspects of the present invention.

Then a contact material 354 may be deposited over the device 350, as depicted in FIG. 36. Next, the device 350 may be planarized by, for example, chemical mechanical planarization, to remove the contact material 354 down to the self-aligned contacts 322, as illustrated in FIG. 37. As shown in FIG. 38, an interlayer dielectric layer 356, for example, an oxide layer, may then the applied over the device 350. The interlayer dielectric layer 356 may then be patterned and etched using a photoresist layer to form a patterned layer 358 of interlayer dielectric material, as depicted in FIG. 39. Next, a second layer of contact material 354 may be deposited over the device 350, as illustrated in FIG. 40. The device 350 may then be planarized by, for example, chemical mechanical planarization, to remove the excess contact material 354 to form contacts 360, as shown in FIG. 41. The final device 350 may include contacts 360 that are narrower near the at least one source region 304 and at least one drain region 306 and wider near the top of the device 350.

As may be recognized by those of ordinary skill in the art based on the teachings herein, numerous changes and modifications may be made to the above-described and other embodiments of the present invention without departing from the scope of the invention. For example, the partial spacers may be removed from the device before contact formation or the contacts may be formed over the partial spacers, the partial spacers may be formed before the self-aligned contact or after the self aligned contact, and the contacts may be formed using an interlayer dielectric or formed without using an interlayer dielectric, and other components of the device and/or method as disclosed in the specification, including the accompanying abstract and drawings, may be replaced by alternative component(s) or features(s), such as those disclosed in another embodiment, which serve the same, equivalent or similar purpose as known by those skilled in the art to achieve the same, equivalent or similar results by such alternative component(s) or feature(s) to provide a similar function for the intended purpose. In addition, the devices and systems may include more or fewer components or features than the embodiments as described and illustrated herein. For example, the components and features of FIGS. 3-17, FIGS. 3-17 and 18-20, FIGS. 21-34, and FIGS. 21-28 and 35-41 may all be used interchangeably and in alternative combinations as would be modified or altered by one of skill in the art. Accordingly, this detailed description of the currently-preferred embodiments is to be taken in an illustrative, as opposed to limiting of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    obtaining a wafer with at least two gates;
    forming partial spacers adjacent to the at least two gates, wherein forming the partial spacers comprises:
        etching into an oxide layer between the at least two gates;
        depositing a spacer layer over the wafer; and
        etching the spacer layer to form the partial spacers; and
    forming at least one contact on the wafer;
    depositing a second oxide layer over the wafer after forming the partial spacers; and
    performing planarization to the second oxide layer.

2. The method of claim 1, wherein forming the at least one contact comprises:
    depositing an interlayer dielectric layer over the wafer;
    applying a photoresist layer;
    patterning the photoresist layer;
    etching into the interlayer dielectric layer, the second oxide layer, and the oxide layer between the partial spacers to form at least one cavity;
    removing the photoresist layer;
    depositing at least one contact material over the wafer and into the at least one cavity; and performing planarization to the wafer to remove excess contact material to form the at least one contact.

3. The method of claim 2, further comprising:
etching to remove the partial spacers before depositing the at least one contact material.

4. The method of claim 1, further comprising:
forming a self-aligned contact over each of the at least two gates.

5. A method comprising:
obtaining a wafer with at least two gates;
forming partial spacers adjacent to the at least two gates, wherein forming the partial spacers comprises:
    etching into an oxide layer between the at least two gates;
    depositing a spacer layer over the wafer; and
    etching the spacer layer to form the partial spacers; and
forming at least one contact on the wafer, wherein forming the at least one contact comprises:
    forming at least one cavity between the partial spacers;
    depositing at least one contact material over the wafer and into the at least one cavity;
    performing planarization to the wafer to remove excess contact material to form the at least one contact;
    depositing a second oxide layer over the wafer after planarization of the contact material;
    patterning the second oxide layer;
    depositing a second layer of the at least one contact material; and
    performing planarization to the wafer to remove excess contact material to form the at least one contact.

6. The method of claim 5, wherein forming the at least one contact further comprises:
etching to remove the partial spacers before depositing the at least one contact material.

7. The method of claim 5, wherein forming the at least one cavity between the partial spacers comprises:
etching directly into the interlayer dielectric layer and the oxide layer to form the at least one cavity.

8. The method of claim 5, wherein forming the at least one cavity between the partial spacers comprises:
applying a photoresist layer over the wafer;
patterning the photoresist layer;
etching into the interlayer dielectric layer and the oxide layer to form the at least one cavity.

9. The method of claim 5, wherein forming the at least one cavity between the partial spacers comprises:
depositing a second oxide layer over the wafer;
performing planarization to the second oxide layer;
applying a photoresist layer over the wafer;
patterning the photoresist layer; and
etching into the interlayer dielectric layer and the oxide layer to form the at least one cavity.

* * * * *